(12) United States Patent
Cai et al.

(10) Patent No.: US 10,374,534 B2
(45) Date of Patent: Aug. 6, 2019

(54) MAGNETIC SENSOR INTEGRATED CIRCUIT, MOTOR ASSEMBLY AND APPLICATION APPARATUS

(71) Applicant: Johnson Electric S.A., Murten (CH)

(72) Inventors: Guang Jie Cai, Hong Kong (CN); Chun Fai Wong, Hong Kong (CN)

(73) Assignee: JOHNSON ELECTRIC INTERNATIONAL AG, Murten (CH)

( * ) Notice: Subject to any disclaimer, the term of this patent is extended or adjusted under 35 U.S.C. 154(b) by 63 days.

(21) Appl. No.: 15/581,883

(22) Filed: Apr. 28, 2017

(65) Prior Publication Data
US 2017/0317622 A1 Nov. 2, 2017

(30) Foreign Application Priority Data

Apr. 29, 2016 (CN) .......................... 2016 1 0281787
Jun. 3, 2016 (CN) .......................... 2016 1 0392755

(51) Int. Cl.
| | |
|---|---|
| H02P 6/16 | (2016.01) |
| H02K 11/215 | (2016.01) |
| G01D 5/14 | (2006.01) |
| G01R 33/07 | (2006.01) |
| H02K 21/18 | (2006.01) |
| H02P 6/26 | (2016.01) |
| G01D 3/036 | (2006.01) |

(52) U.S. Cl.
CPC ............... *H02P 6/16* (2013.01); *G01R 33/07* (2013.01); *H02K 11/215* (2016.01); *H02K 21/185* (2013.01); *H02P 6/26* (2016.02); *G01D 3/036* (2013.01); *G01D 5/145* (2013.01)

(58) Field of Classification Search
USPC .................................... 318/400.38, 647, 653
See application file for complete search history.

(56) References Cited

U.S. PATENT DOCUMENTS

| | | | |
|---|---|---|---|
| 2010/0090633 A1* | 4/2010 | Deller .................... | H02K 29/08 318/400.39 |
| 2011/0018533 A1* | 1/2011 | Cesaretti ............. | G01R 33/0035 324/251 |
| 2012/0025817 A1* | 2/2012 | Romero ............. | G01R 33/0029 324/251 |
| 2015/0176963 A1* | 6/2015 | Diaconu .............. | G01R 33/077 702/95 |
| 2015/0222192 A1* | 8/2015 | Freeman ................. | H02M 1/08 363/21.09 |

* cited by examiner

*Primary Examiner* — Jorge L Carrasquillo
(74) *Attorney, Agent, or Firm* — Muncy, Geissler, Olds & Lowe, P.C.

(57) ABSTRACT

A magnetic sensor integrated circuit includes a rectifier circuit, a magnetic field detection circuit, and a timing controller. The rectifier circuit converts an external power into a DC power. The magnetic field detection circuit senses a polarity of an external magnetic field and outputting a magnetic detection signal; and the magnetic field detection circuit includes a first chopping switch, a first amplifier unit and a switched capacitor filter module. The timing controller outputs a first clock signal to the first chopping switch and the first amplifier unit, and a second clock signal delayed for the first clock signal with a first predetermined time to the switched capacitor filter module.

18 Claims, 14 Drawing Sheets

MAGNETIC SENSOR INTEGRATED CIRCUIT, MOTOR ASSEMBLY AND APPLICATION APPARATUS

CROSS REFERENCE TO RELATED APPLICATIONS

This non-provisional patent application claims priority under 35 U.S.C. § 119(a) from Patent Application No. 201610281787.2 filed in the People's Republic of China on Apr. 29, 2016 and 201610392755.X filed in the People's Republic of China on Jun. 3, 2016.

FIELD

The present disclosure relates to magnetic field detection, more particularly, to a magnetic sensor integrated circuit, a motor assembly and an application apparatus.

BACKGROUND

Magnetic sensors are widely applied in modern industries and electronic products to induce a magnetic field strength for measuring physical parameters such as current, position and direction. The motor is an important application field of magnetic sensor. The magnetic sensor may serve as a rotor magnetic-pole position sensor in the motor.

In general, the magnetic sensor can only output a magnetic field detection signal. However, the magnetic field detection signal is weak and mixed with offset of the magnetic sensor; it's difficult to obtain an accurate magnetic field detection signal.

SUMMARY

In an aspect of the present disclosure, a magnetic sensor integrated circuit is provided, which includes: a rectifier circuit converting an external power into a DC power; a magnetic field detection circuit sensing a polarity of an external magnetic field and outputting a magnetic detection signal; wherein the magnetic field detection circuit comprises a first chopping switch, a first amplifier unit and a switched capacitor filter module; a timing controller outputting a first clock signal to the first chopping switch and the first amplifier unit, and a second clock signal delayed for the first clock signal with a first predetermined time to the switched capacitor filter module.

BRIEF DESCRIPTION OF THE DRAWINGS

To illustrate technical solutions according to embodiments of the disclosure or in the conventional technology more clearly, the following briefly describes the drawings according to embodiments of the disclosure. Apparently, the drawings are only some embodiments of the present disclosure, and other drawings may be obtained by those skilled in the art according to those drawings without creative efforts.

FIG. 1b is a time-sequence diagram of clock signals of the magnetic sensor integrated circuit of FIG. 1a.

FIG. 3b is a time-sequence diagram of four sub clock signals of the magnetic sensor and the first chopping switch of FIG. 3a.

FIG. 3c is a schematic diagram of control signals of a discharging switch and a first chopping switch of FIG. 3a.

FIG. 3d is a schematic signal diagram of a circuit shown in FIG. 3a.

FIG. 6b is a time-sequence diagram of clock signals of FIG. 6a.

DETAILED DESCRIPTION OF EMBODIMENTS

The technical solutions of embodiments of the disclosure will be illustrated clearly and completely in conjunction with the drawings of the embodiments of the disclosure. Apparently, the described embodiments are only a few embodiments rather than all embodiments of the disclosure. Any other embodiments obtained by those skilled in the art on the basis of the embodiments of the present disclosure without creative work will fall within the scope of the present disclosure.

As described in the Background section, in the conventional technologies, generally, a magnetic sensor integrated circuit can only output a magnetic field detection result, and an additional peripheral circuit is required to process the magnetic detection result. Therefore, the whole circuit has a high cost and a poor reliability.

In view of this, a magnetic sensor integrated circuit, an electric motor assembly and an application apparatus are provided according to embodiments of the disclosure, to reduce cost of the whole circuit and improve reliability of the whole circuit by expanding functions of a conventional magnetic sensor integrated circuit. In order to achieve the above object, the technical solutions according to the embodiments of the present disclosure are described in detail in conjunction with FIG. 1a to FIG. 14.

Figure 1A:
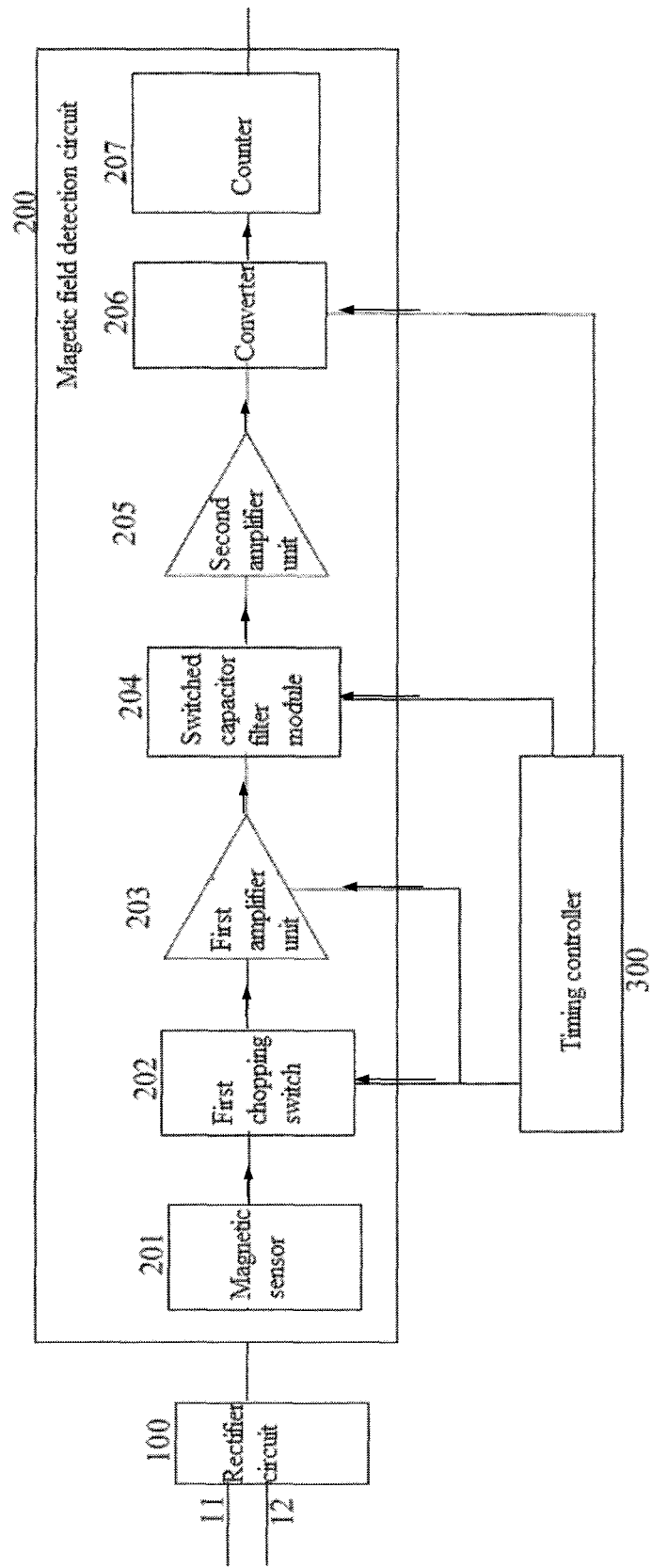
FIG. 1a is a block diagram of a magnetic sensor integrated circuit according to an embodiment of the present disclosure.

FIG. 1a shows a schematic structural diagram of a magnetic sensor integrated circuit according to an embodiment of the present disclosure. The magnetic sensor integrated circuit can comprise a rectifier circuit 100, a magnetic detection circuit 200 and a timing controller 300.

The rectifier circuit 100 can convert an external power into a direct-current power and supply power for the magnetic field detection circuit 200.

The magnetic field detection circuit 200 can sense a polarity of an external magnetic field and output a magnetic detection signal. In the embodiment, the magnetic field detection circuit 200 can comprise a magnetic sensor 201, a first chopping switch 202, a first amplifier unit 203, a switched capacitor filter module 204, a second amplifier unit 205, and a converter 206 which are electrically connected sequentially.

The timing controller 300 can output a first clock signal to the first chopping switch 202 and the first amplifier unit 203, output a second clock signal to the switched capacitor filter module 204, and output a third clock signal to the converter 206. In the embodiment, the second clock signal is delayed for the first clock signal with a first predetermined time, the second clock signal is delayed for the third clock signal with a second predetermined time; and the first predetermined time is longer than the second predetermined time.

Figure 1B:
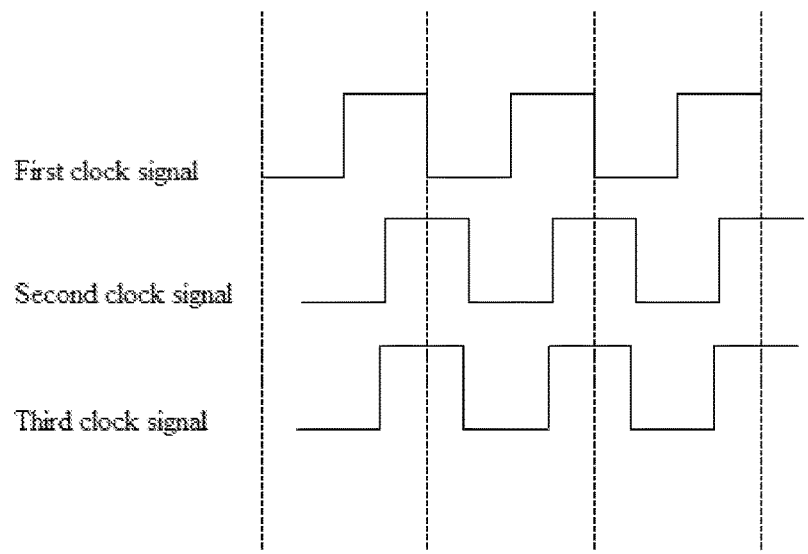

In the embodiment, the first, second and third clock signal can have a same frequency as shown in FIG. 1b. The first predetermined time can be 14 period of the first clock signal, the second predetermined time can be a few of nanoseconds, such as 5 nanoseconds. FIG. 1b only shows a time-sequence of the first, second and third clock signals and does not present a true shape of the clock signals of the magnetic sensor integrated circuit.

In the embodiment of the present disclosure, the external power is provided to the rectifier circuit via the input port, and the input port may include a first input port 11 and a second input port 12 which are electrically connected to the external power. In the embodiment of the present disclosure, the connection between the input port and the external power may be a direct connection or an indirect connection, which is not limited herein and needs to be designed based on actual applications. In the embodiment of the present disclosure, the external power received by the rectifier circuit is an alternating-current power. In addition, the constant current, which is not affected by temperature change, received by the magnetic sensor may be provided by the rectifier circuit, which is not limited herein.

Figure 2:
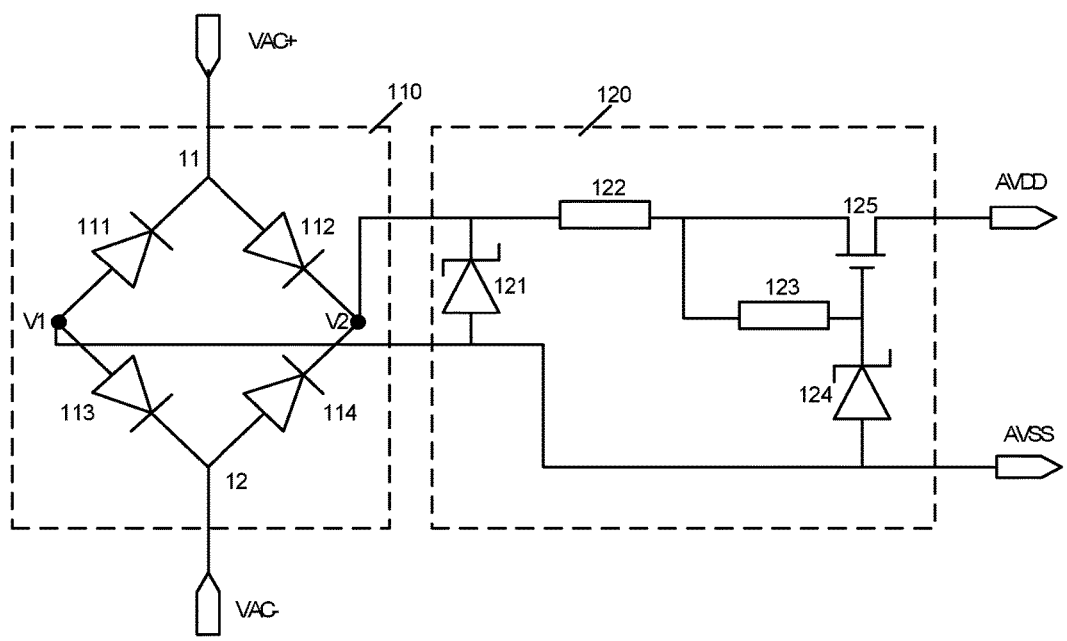
FIG. 2 is a circuit diagram of a rectifier circuit according to an embodiment of the present disclosure.

In an embodiment of the present disclosure, the rectifier circuit 100 may include a full-wave rectifier bridge and a voltage stabilizing unit coupled to an output end of the full-wave rectifier bridge. The full-wave rectifier bridge can convert an alternating-current signal output by the alternating-current power into a direct-current signal, and the voltage stabilizing unit can stabilize the direct-current signal output by the full-wave rectifier bridge in a predetermined range. FIG. 2 shows a circuit diagram of a rectifier circuit according to an embodiment of the present disclosure, a full-wave rectifier bridge 110 can include a first diode 111 and a second diode 112 which are coupled in series, and a third diode 113 and a fourth diode 114 which are coupled in series. A first input end 11 is a common end between the first diode 111 and the second diode 112 and electrically connected to an alternating-current power VAC+, and a second input end 12 is a common end between the third diode 113 and the fourth diode 114 and electrically connected to an alternating-current power VAC−.

An input end of the first diode 111 is electrically connected to an input end of the third diode 113 to form a first output end V1 of the full-wave rectifier bridge 110, and an output end of the second diode 112 is electrically connected to an output end of the fourth diode 114 to form a second output end V2 of the full-wave rectifier bridge 110. The second output end V2 outputs a direct-current voltage of about 16V. Preferably, the output control circuit 400 is powered by the direct-current voltage output by the second output end V2 of the full-wave rectifier bridge 110.

Moreover, a voltage stabilizing unit 120 includes a Zener diode 121, a first resistor 122, a second resistor 123, a Zener diode 124 and a transistor 125 which are electrically connected between the first output end V1 and the second output end V2 of the full-wave rectifier bridge 110. An anode of the Zener diode 121 and an anode of the Zener diode 124 are both coupled to the first output end V1 of the full-wave rectifier bridge 110. A cathode of the Zener diode 121 and a first end of the first resistor 122 are both coupled to the second output end V2 of the full-wave rectifier bridge 110. A second end of the first resistor 122 is coupled to a first end of the second resistor 123 and a first end of the transistor 125. A second end of the second resistor 123 is electrically connected to a gate of the transistor 125 and a cathode of the Zener diode 124. A second end of the transistor 125 and an anode of the Zener diode 124 respectively serve as two output ends of the voltage-regulation unit 120, i.e. two output ends of the rectifier circuit. An output voltage of the first output end AVDD of the rectifier circuit is a direct-current voltage of about 5V, and the second output end AVSS is grounded.

As shown in FIG. 1, an input terminal of the magnetic sensor 201 is electrically to an output end of the rectifier circuit 100. The magnetic sensor 201 is configured to sense the polarity of the external magnetic field and output a magnetic differential signal to the first chopping switch 202. The magnetic differential signal can comprise a magnetic field signal and an offset signal. The first chopping switch 202 can modulate the magnetic field signal and the offset signal of the differential signal output by the magnetic sensor 201, to a high frequency region and a baseband frequency respectively under control of the timing controller 300. Preferably, a frequency of the high frequency region is greater than 100K Hz and a baseband frequency is less than 200 Hz.

Figure 3A:
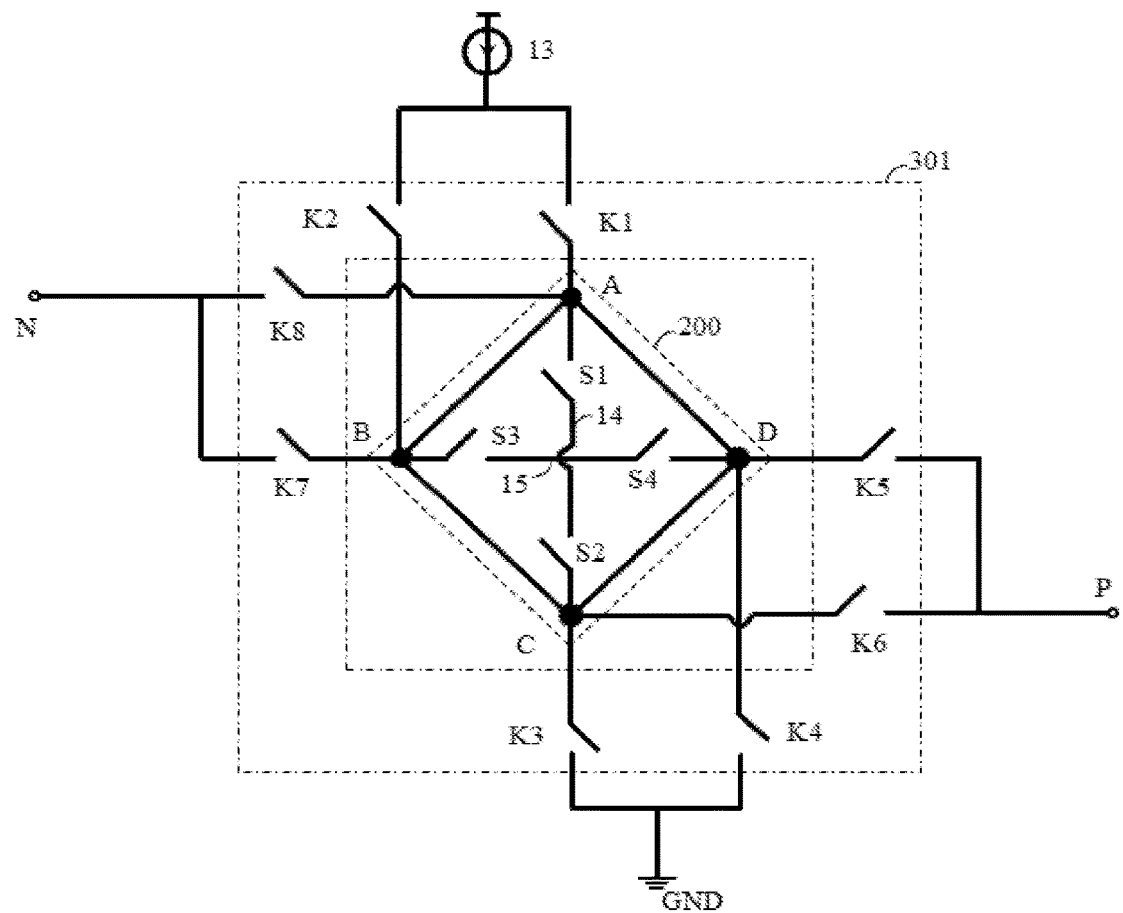
FIG. 3a is a structural diagram of a magnetic sensor and a first chopping switch according to an embodiment of the present disclosure.
Figure 3B:
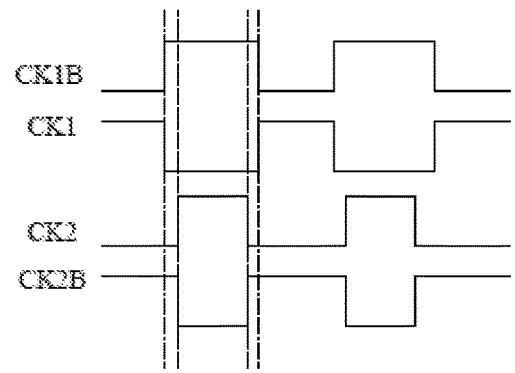
Figure 3C:
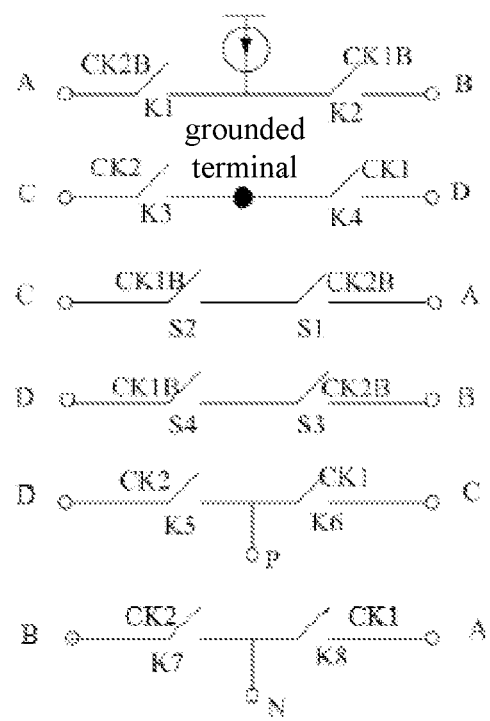

References are made to FIGS. 3a to 3c. FIG. 3a is a structural diagram of a magnetic sensor and a first chopping switch according to an embodiment of the present disclosure. FIG. 3b is a timing diagram of four sub clock signals of the magnetic sensor and the first chopping switch shown in FIG. 3a. FIG. 3c is a schematic diagram of signal controls of a discharging switch and the first chopping switch shown in FIG. 3a.

The magnetic sensor 201 includes four contact terminals. The magnetic sensor 201 includes a first terminal A and a third terminal C which are arranged oppositely, and a second terminal B and a fourth terminal D which are arranged oppositely. In the embodiment of the present disclosure, the magnetic sensor 201 is a Hall plate. The magnetic sensor 200 is driven by a first power source 13 which may be provided by the rectifier circuit 100. In the embodiment, the first power source 13 is a constant current source not affected by temperature change.

The first chopping switch 202 includes eight switches: K1 to K8 as shown in FIG. 3a, which are electrically connected to the four terminals. Specifically, the first chopping switch 202 includes a first switch K1, a second switch K2, a third switch K3, a fourth switch K4, a fifth switch K5, a sixth switch K6, a seventh switch K7 and an eighth switch K8. The first switch K1 is electrically connected between the first power source 13 and the first terminal A. The second switch K2 is electrically connected between the first power source 13 and the second terminal B. The third switch K3 is electrically connected between a grounded end GND and the third terminal C. The fourth switch K4 is electrically connected between the grounded end GND and the fourth terminal D. The fifth switch K5 is electrically connected between a first output end P and the fourth terminal D. The sixth switch K6 is electrically connected between the first output end P and the third terminal C. The seventh switch K7 is electrically connected between a second output end N and the second terminal B. The eighth switch K8 is electrically connected between the second output end N and the first terminal A. The first clock signal includes a first sub clock signal CK2B, a second sub clock signal CK1B, a third clock signal CK2 and a fourth sub clock signal CK1. The first switch K1 and the second switch K2 are respectively controlled by the first sub clock signal CK2B and the second sub clock signal CK1B. The third switch K3 and the fourth switch K4 are respectively controlled by the third sub clock signal CK2 and the fourth sub clock signal CK1. The fifth switch K5 and the sixth switch K6 are respectively controlled by the third sub clock signal CK2 and the fourth sub clock signal CK1. The seventh switch K7 and the eighth switch K8 are respectively controlled by the third sub clock signal CK2 and the fourth sub clock signal CK1.

In order to ensure an accuracy of an output signal, the first clock signal includes at least two non-overlapping sub clock signals. A phase of the first sub clock signal CK2B is opposite to a phase of the third sub clock signal CK2, and a phase of the second sub clock signal CK1B is opposite to a phase of the fourth sub clock signal CK1. The third sub clock signal CK2 and the fourth sub clock signal CK1 are non-overlapping sub clock signals.

When the first terminal A is electrically connected to the first power source 13 and the third terminal C is electrically connected to the grounded end GND, the second terminal B is electrically connected to the second output end N and the fourth terminal D is electrically connected to the first output end P. When the second terminal B is electrically connected to the first power source 13 and the fourth terminal D is electrically connected to the grounded end GND, the first terminal A is electrically connected to the second output end N and the third terminal C is electrically connected to the first output end P. The first output end P outputs a differential signal P1, and the second output end N outputs a differential signal N1.

Besides the magnetic sensor 201 and the first chopping switch 202 described, the magnetic sensor 201 further includes a first discharging branch 14 electrically connected between the first terminal A and the third terminal C, i.e. a branch between the first terminal A and the third terminal C, and a second discharging branch 15 electrically connected between the second terminal B and the fourth terminal D, i.e. a branch between the second terminal B and the fourth terminal D. Before the first terminal A and the third terminal C serve as power input ends and the second terminal B and the fourth terminal D serve as magnetic sensed signal output ends, the second discharging branch 15 is conductive. Before the first terminal A and the third terminal C serve as magnetic sensed signal output ends and the second terminal B and the fourth terminal D serve as power input ends, the first discharging branch 14 is conductive.

In a possible implementation, the first discharging branch 14 may include a first discharging switch S1 and a second discharging switch S2 which are electrically connected in series. The first discharging switch S1 and the second discharging switch S2 are respectively controlled by the first sub clock signal CK2B and the second sub clock signal CK1B. The second discharging branch 15 includes a third discharging switch S3 and a fourth discharging switch S4 which are electrically connected in series. The third discharging switch S3 and the fourth discharging switch S4 are respectively controlled by the first sub clock signal CK2B and the second sub clock signal CK1B.

When the first terminal A and the third terminal C serve as power input ends and the second terminal B and the fourth terminal D serve as output ends of the magnetic field signal, during a period that the first sub clock signal CK2B overlaps with the second sub clock signal CK1B, the first discharging switch S1 and the second discharging switch S2 are simultaneously turned on. When the first terminal A and the third terminal C serve as output ends of the magnetic field signal and the second terminal B and the fourth terminal D serve as power input ends, during a period that the first sub clock signal CK2B overlaps with the second sub clock signal CK1B, the third discharging switch S3 and the fourth discharging switch S4 are simultaneously turned on.

As shown in FIG. 3b, the four sub clock signals includes two non-overlapping control signals, i.e. the third sub clock signal CK1 and the fourth sub clock signal CK2, and two overlapping control signals, i.e. the second sub clock signal CK1B and the first sub clock signal CK2B. CK1 is opposite to CK1B and CK2 is opposite to CK2B. The overlapping sub clock signals CK1B and CK2B are both at a high level during the period in which CK1B overlaps with CK2B, i.e., a period of time between two dotted lines as shown in FIG. 3b. The two non-overlapping sub clock signals CK1 and CK2 and the two overlapping sub clock signals CK1B and CK2B may have a frequency ranging from 100 KHz to 600 KHz inclusively, and preferably may have a frequency of 400 KHz.

In the embodiment of the present disclosure, the eight switches included in the first chopping switch 202 and the four discharging switches included in the discharging branches each may be a transistor. Furthermore, when CK1 is high level, CK2B is high level, and CK2 and CK1B are low level. In conjunction with FIG. 3c, in such case, the second terminal B and the fourth terminal D are respectively electrically connected to the first power source 13 and the grounded end GND and serve as the power input ends, the switches between the third terminal C and the first output end P are turned on, the switches between the first terminal A and the second output N are turned on, and the first terminal A and the third terminal C serve as output ends of the magnetic field signal. A short period of time just after transition of CK1 from the high level to the low level, i.e. a period of time between the first two dotted lines as shown in FIG. 3b, is an overlapping period of the two overlapping sub clock signals CK1B and CK2B. In the overlapping period, CK1B and CK2B are both high level, the third discharging switch S3 and the fourth discharging switch S4 between the second terminal B and the fourth terminal D are simultaneously turned on, and the second terminal B is short-circuited with the fourth terminal D thereby eliminating charges stored in a parasitic capacitor between the second terminal B and the fourth terminal D. After the overlapping period, when CK1 is low level, CK2B is low level, and CK2 and CK1B are high level. In this case, the first terminal A and the third terminal C are respectively electrically connected to the first power and the grounded end GND and serve as power input ends, the switches between the second terminal B and the first output end P are turned on, the switches between the fourth terminal D and the second output end N are turned on, and the second terminal B and the fourth terminal D serve as output ends of the magnetic field signal. A short period of time just before transition of CK1 from the low level to the high level, i.e. a period of time between the second two dotted lines as shown in FIG. 3b, is an overlapping period of the two sub clock signals CK1B and CK2B. In this period, CK1B and CK2B are both high level, the first discharging switch S1 and the second discharging switch S2 between the first terminal A and the third terminal C are turned on, and the terminal A is short-circuited with the third terminal C, thereby eliminating charges stored in a parasitic capacitor between the first terminal A and the third terminal C.

Figure 3D:
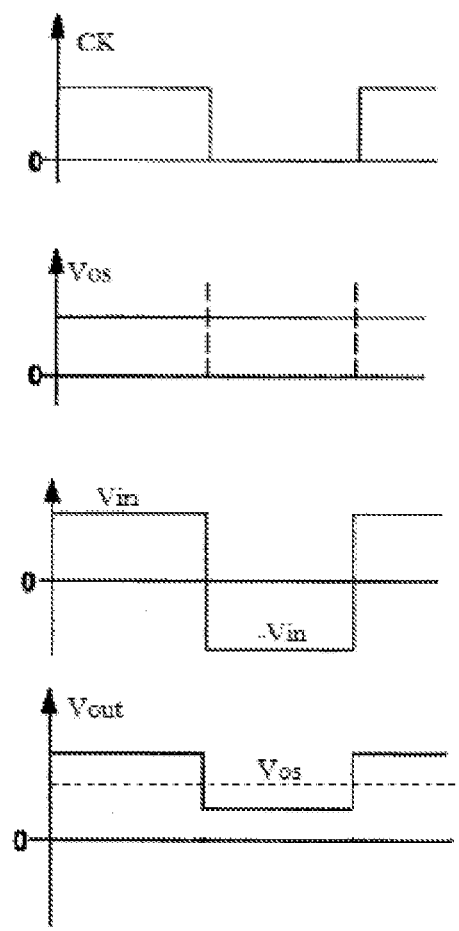

FIG. 3d is a schematic diagram of signals in the circuit shown in FIG. 3a. In FIG. 3d, CK is a clock signal, Vos is an offset voltage signal of the magnetic sensor 201 which may be assumed to be constant at any instant in a clock signal cycle and depends on a physical property of the Hall plate 201. Vin and −Vin are ideal magnetic field signals output by the first chopping switch in a first half cycle and a second half cycle of the clock signal CK respectively, i.e., ideal outputs of the Hall plate 201 not interfered by an offset signal. As described in the above, in the first half cycle of the clock signal CK, the terminals A and C are electrically connected to the first power and the ground respectively, and the terminals B and D are electrically connected to output ends. In the second half of the cycle of the clock signal CK, the terminals B and D are respectively electrically connected to the first power and the ground, and the terminals A and C are electrically connected to output ends. In the first and second half cycles of the clock signal CK, the ideal magnetic field signals output by the first chopping switch have the same magnitude and opposite directions. Vout is an output signal of the first chopping switch, which is a signal superposition of the offset signal Vos and the ideal magnetic field signal Vin. In this way, the magnetic field signal is modulated to the high frequency region with the first chopping switch.

In an embodiment of the present disclosure, the ideal magnetic field voltage signal output by the magnetic sensor 200 is very weak. Generally, the ideal magnetic field signal is only a few tenths millivolts, and the offset signal is close to 10 millivolts. Therefore, it is required to eliminate the offset signal and amplify the ideal magnetic field signal subsequently. As shown in FIG. 1, the first amplifier unit 203 according to the embodiment amplify the differential signal output by the first chopping switch 202, demodulate the magnetic field signal of the differential signal output by the first chopping switch 202 to a low frequency area and outputs the demodulated differential signal, based on the control of the timing controller 300.

Figure 4:
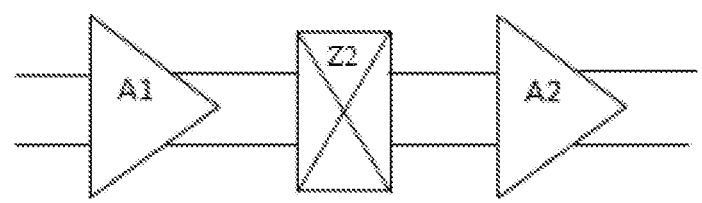
FIG. 4 is a schematic diagram of a first amplifier unit according to an embodiment of the present disclosure.

In an embodiment of the present disclosure, the first amplifier unit 203 may be a chopping-amplifier unit as shown in FIG. 4. That is, the first amplifier unit 203 comprises a first amplifier A1, a second chopping switch Z2 and a second amplifier A2 which are sequentially electrically connected. The first amplifier A1 and the second amplifier A2 can amplify input signals. The second chopping switch Z2 can demodulate the magnetic field signal of the differential signal output by the first chopping switch 202 to the low frequency region. The first amplifier A1 may be a folded-cascode amplifier and the second amplifier A2 may be a single-stage amplifier.

In reference with the integrated circuit shown in FIG. 3, the first amplifier A1 and the second amplifier A2 are configured to amplify input signals, the second chopping switch Z2 is configured to demodulate the magnetic field signal of the differential signal output by the first chopping switch 202 to the low frequency region under control of the first clock signal.

In the embodiment of the present disclosure, the first amplifier A1 receives a pair of differential signals P1 and N1 output by the first chopping switch 202, and output a pair of differential signals. The second chopping switch Z2 directly outputs the pair of differential signals output by the first amplifier A1 in a first half cycle of each clock cycle, and exchanges the two differential signals output by the first amplifier A1 and outputs the exchanged differential signals in a second half cycle of each clock cycle. The output signals of the second chopping switch Z2 are defined as P2 and N2.

Figure 5:
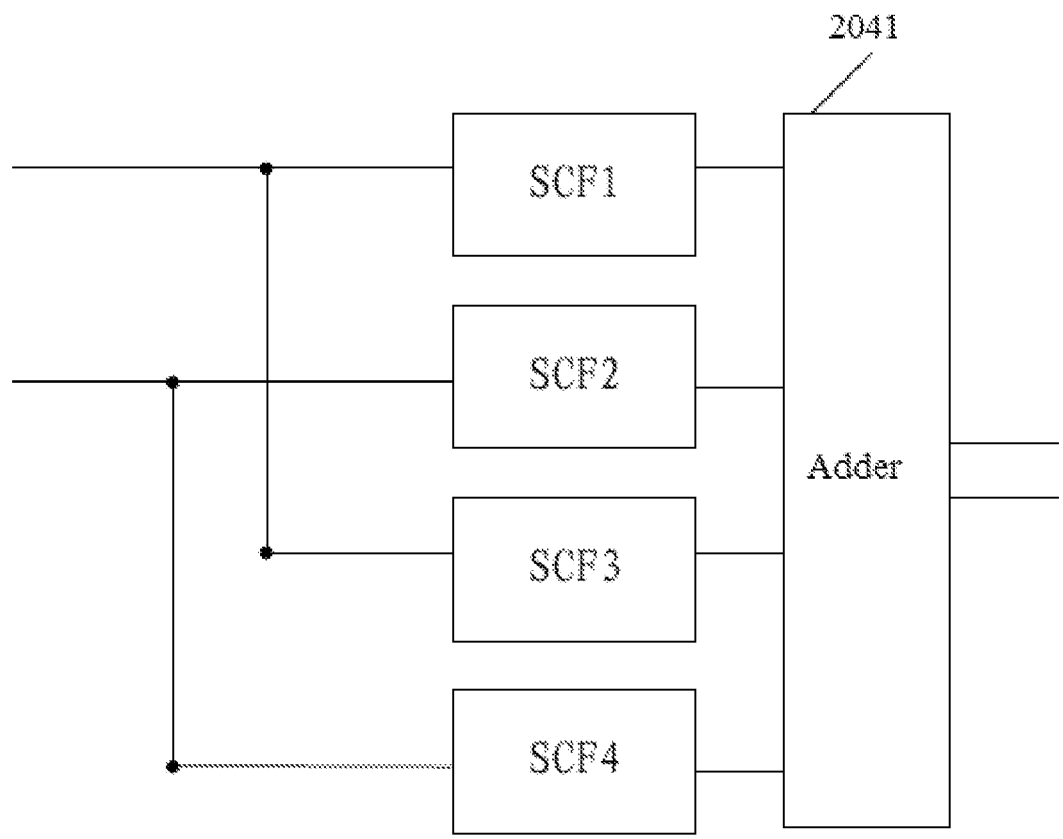
FIG. 5 is a schematic diagram of a switched capacitor filter module according to an embodiment of the present disclosure.

As shown in FIG. 5, after the previous signal processing, the switched capacitor filter module 204 according to the embodiment of the present disclosure samples the differential signals output by the first amplifier unit 203, eliminates the offset of the sampled signal to obtain a differential signal, amplify the differential signal, and outputs the amplified differential signal, under control of the timing controller 300. Optionally, in the embodiment of the present disclosure, a sampling frequency of the switched capacitor filter module 204 may be the same as a chopping frequency of the first chopping switch, that is, frequencies of the first clock signal and the second clock signal output by the timing controller are the same. The differential signal output by the first amplifier unit 203 includes a first sub differential signal and a second sub differential signal.

In an embodiment of the present disclosure, the switched capacitor filter module may be a switched capacitor filter module as shown in FIG. 5. The switched capacitor filter module 204 includes a first switched capacitor filter SCF1, a second switched capacitor filter SCF2, a third switched capacitor filter SCF3 and a fourth switched capacitor filter SCF4. The first switched capacitor filter SCF1 and the second switched capacitor filter SCF2 sample the differential signal output by the first amplifier unit during a first half cycle thereof as a first sampled signal. The third switched capacitor filter SCF3 and the fourth switched filter SCF4 can sample the differential signal output by the first amplifier unit during a second half cycle thereof as a second sampled signal.

Figure 6A:
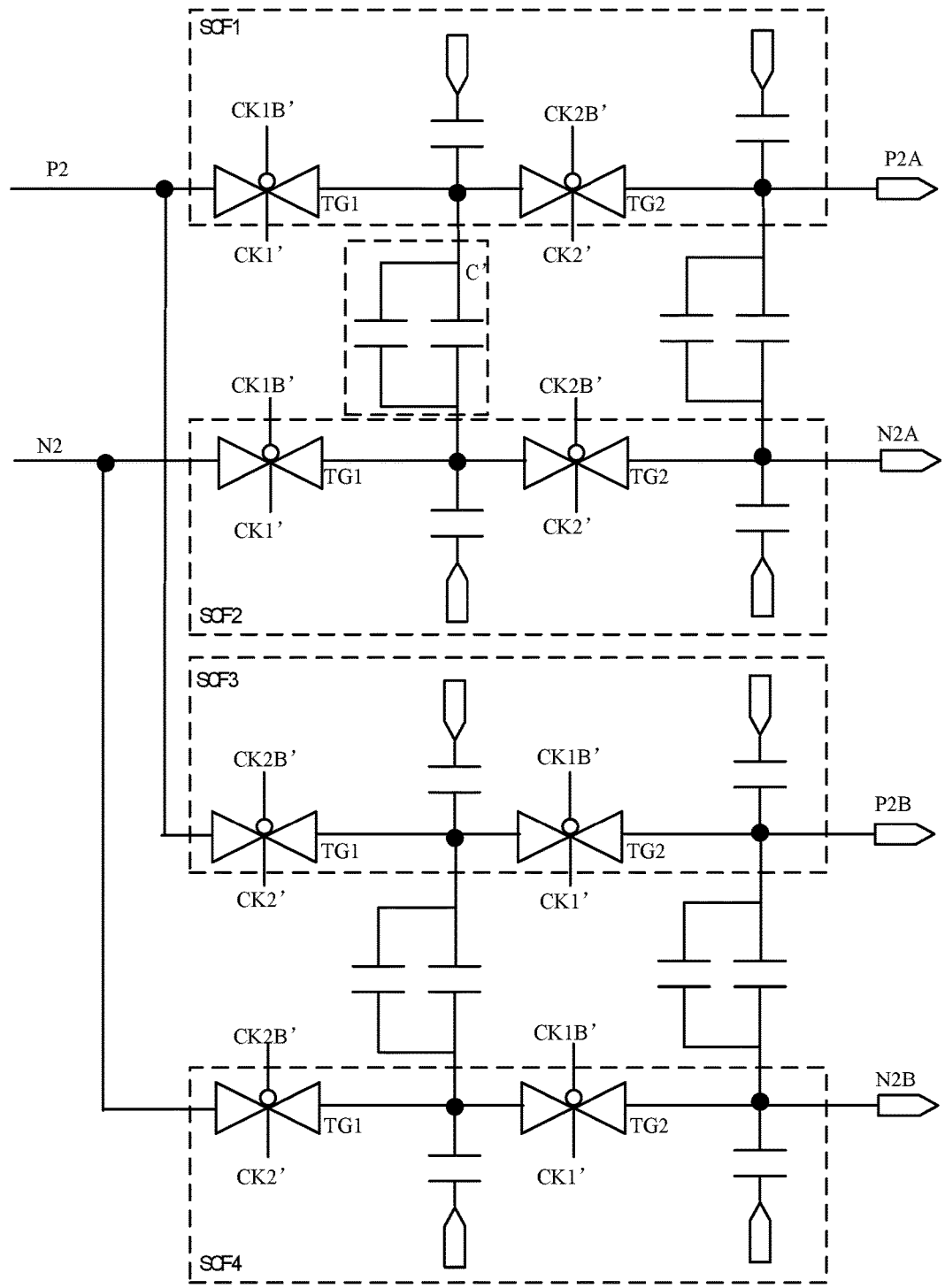
FIG. 6a is a circuit diagram of the switched capacitor filter module of FIG. 5.
Figure 6B:
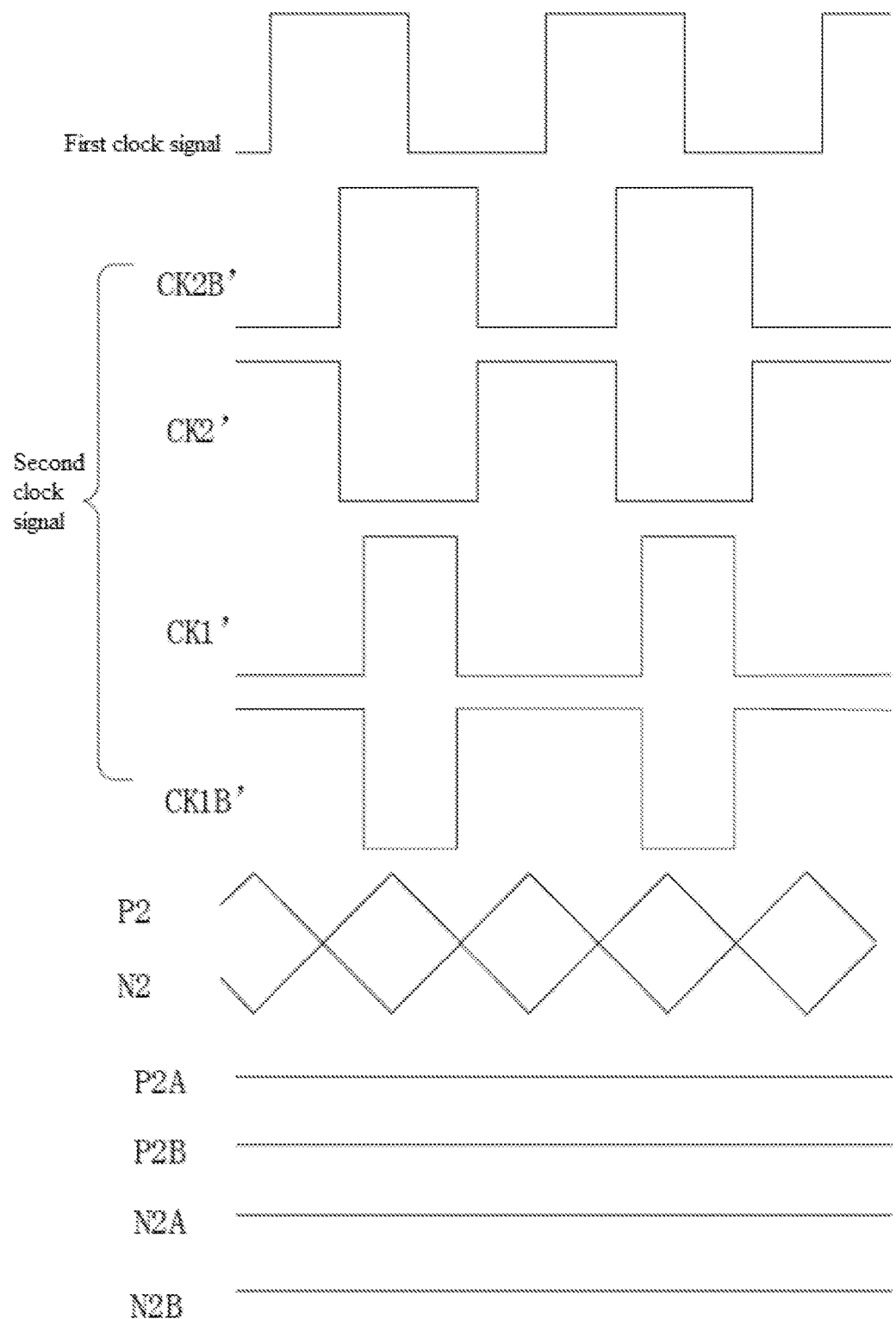

FIG. 6a shows a schematic circuit diagram of the switched capacitor filter, FIG. 6b shows a time sequence diagram of the switched capacitor filter of FIG. 6a. Each of the first switched capacitor filter SCF1, the second capacitor filter SCF2, the third capacitor filter SCF3, the fourth capacitor filter SCF4 can comprise two transmission gate switches and two capacitors (a dotted line frame as shown in FIG. 6a).

The first switched capacitor filter SCF1 and the second switched capacitor filter SCF2 are configured to sample the first sub differential signal and the second sub differential signal output by the first amplifier unit 203 in first half cycles thereof as a first sub sampled signal and a second sub sampled signal respectively. The third switched capacitor filter SCF3 and the fourth switch filter SCF4 can sample the first sub differential signal and the second sub differential signal output by the first amplifier unit 203 in second half cycles thereof as a third sub sampled signal and a fourth sub sampled signal respectively. As shown in FIG. 6a, a sample clock signal of the switched capacitor filter module 204 can comprise four sub clock signals CK1', CK2', CK1B', and CK2B', each transmission gate switch is controlled by one sub clock signal.

When the differential signals P2 and N2 are received by the switched capacitor filter module 204, a first transmission gate switches TG1 of the first switched capacitor filter SCF1 and the second switched capacitor filter SCF2 are turned on, a second transmission gate switches TG2 of the first switched capacitor SCF1 and the second switched capacitor filter SCF2 are turned off, a first transmission gate switches TG1 of the third switched capacitor filter SCF3 and the fourth switched capacitor filter SCF4 are turned off, and a second transmission gate switches TG2 of the third switched capacitor filter SCF3 and the fourth switched capacitor filter SCF4 are turned on, in first half cycles. In second half cycles, the first transmission gate switches TG1 of the first switched capacitor filter SCF1 and the second switched capacitor filter SCF2 are turned off, the second transmission gate switches TG2 of the first switched capacitor SCF1 and the second switched capacitor filter SCF2 are turned on, the first transmission gate switches TG1 of the third switched capacitor filter SCF3 and the fourth switched capacitor filter SCF4 are turned on, and the second transmission gate switches TG2 of the third switched capacitor filter SCF3 and the fourth switched capacitor filter SCF4 are turned off. The first and third switched capacitor filters sample first differential signal P2 in first and second half cycles, respectively; and the second and fourth switched capacitor filters sample second differential signal N2 in first and second half cycles, respectively.

As shown in FIG. 6a, a plurality of metal-insulator-metal (MIM) capacitors coupled between the first switched capacitor filter SCF1 and the second switched capacitor SCF2 in parallel. A plurality of metal-insulator-metal (MIM) capacitors coupled between the third switched capacitor filter SCF3 and the fourth switched capacitor filter SCF4. Two groups of capacitors are coupled between the first switched capacitor filter SCF1 and the second switched capacitor SCF2, each group of capacitor can comprise two capacitors coupled in parallel. One group of capacitor is electrically coupled between a common terminal of the two transmission gate switches of the first switched capacitor filter SCF1 and a common terminal of the two transmission gate switches of the second switched capacitor filter SCF2; and the other group of capacitor is electrically coupled between an output terminal of the second transmission gate switch TG2 of the first switched capacitor filter SCF1 and an output terminal of the second transmission gate switch TG2 of the second switched capacitor SCF2. Two groups of capacitors are coupled between the third switched capacitor filter SCF3 and the fourth switched capacitor SCF4, each group of capacitor can comprise two capacitors coupled in parallel. One group of capacitor is electrically coupled between a common terminal of the two transmission gate switches of the third switched capacitor filter SCF3 and a common terminal of the two transmission gate switches of the fourth switched capacitor filter SCF4; and the other group of capacitor is electrically coupled between an output terminal of the second transmission gate switch TG2 of the third switched capacitor filter SCF3 and an output terminal of the second transmission gate switch TG2 of the fourth switched capacitor SCF4.

A frequency of the sample clock signals is the same as a frequency of the clock signal of the magnetic sensor. The sample clock signals is delayed for the clock signal of the magnetic sensor with a predetermined time, such as, ¼ period of the clock signal of the magnetic sensor, a peak and a trough of the differential signals can be avoided.

The first switched capacitor filter SCF1 and the second switched capacitor SCF2 respectively sample the differential signals P2 and N2 in first half cycles thereof as a first sub sampled signal P2A and a second sub sampled signal N2A. The third switched capacitor filter SCF3 and the fourth switched capacitor filter SCF4 respectively sample the differential signals P2 and N2 in second half cycles thereof as a third sub sampled signal P2B and a fourth sub sampled signal N2B.

Figure 6C:
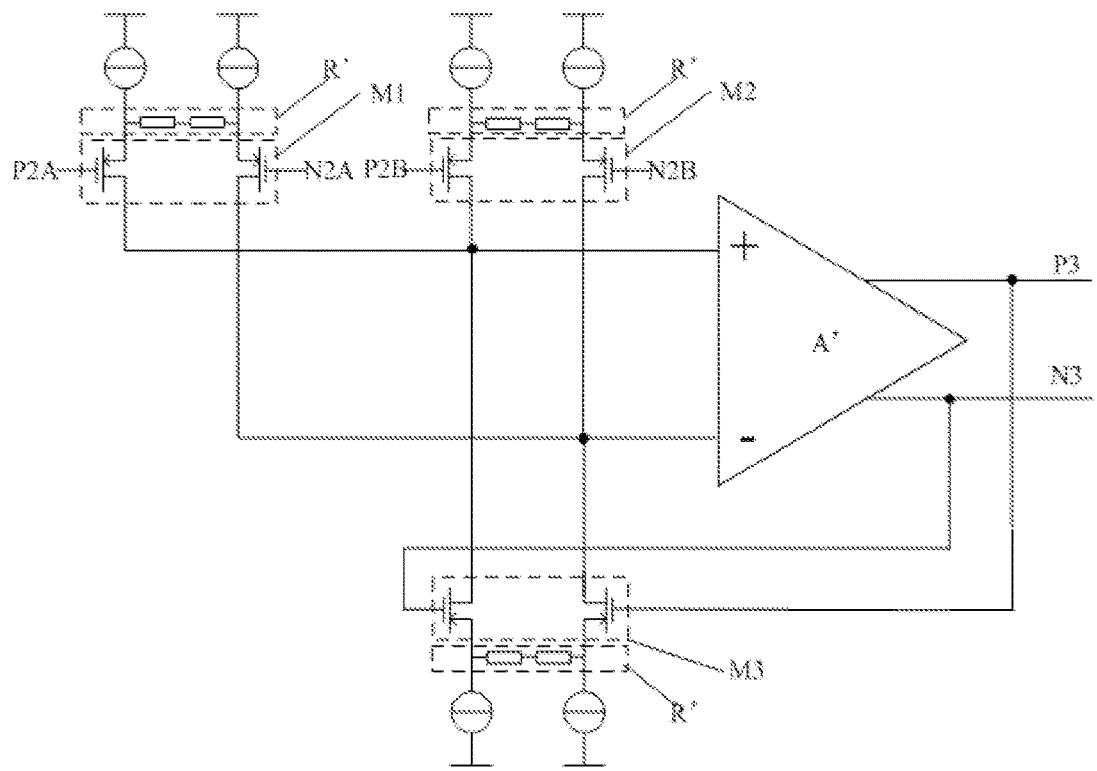
FIG. 6c is a schematic diagram of an adder according to an embodiment of the present disclosure.

The offset is eliminated by adding the first sub sampled signal with the third sub sampled signal, and the offset is eliminated by adding the second sub sampled signal with the fourth sub sampled signal. As shown in FIG. 6c, the switched capacitor filter module 204 further includes an adder 2041 configured to eliminate the offset by adding the first sampled signal with the second sampled signal to obtain a differential signal and amplify the differential signal. Specifically, the adder 2041 is configured to add the first sub sampled signal P2A with the third sub sampled signal P2B to eliminate the offset and add the second sub sampled signal N2A with the fourth sub sampled signal N2B to eliminate the offset, to obtain differential signals, and amplify the differential signals. Differential signals output by the adder are defined as P3 and N3. Optionally, the adder according to the embodiment of the present disclosure is a transconductance amplifier with a gain of 2.

As shown in FIG. 6c which is a structural diagram of an adder according to an embodiment of the present disclosure, the adder includes an operational amplifier A', a first voltage-current converter M1, a second voltage-current converter M2 and a third voltage-current converter M3. Each of the voltage-current converters is electrically connected to a current source, and includes two metal oxide semiconductor (MOS) transistors. For the first voltage-current converter M1, a gate of a MOS transistor receives the sampled signal P2A, and an output end of the MOS transistor is electrically coupled to a non-inverting end of the operational amplifier A', a gate of the other MOS transistor is configured to receive the sampled signal N2A, and an output end of the other MOS transistor is electrically coupled to an inverting end of the operational amplifier A'. For the second voltage-current converter M2, a gate of a MOS transistor of is configured to receive the sampled signal P2B and an output end of the MOS transistor is electrically connected to the non-inverting end of the operational amplifier A', a gate of the other MOS transistor can receive the sampled signal N2B and an output end of the other MOS transistor is electrically connected to the inverting end of the operational amplifier A'. For the third voltage-current converter M3, a gate of a MOS transistor can receive the differential signal N3 output by the operational amplifier A', and an output end of the MOS transistor is electrically coupled to the non-inverting end of the operational amplifier A', a gate of the other MOS transistor can receive the differential signal P3 output by the operational amplifier A', and an output end of the MOS transistor is electrically connected to the inverting end of the operational amplifier A'. The voltage-current converters of the adder convert input sampled signals into currents, and eliminate offsets by adding the currents. The currents are output after being amplified by the operational amplifier of the adder. Preferably, a source degeneration resistor is arranged at the input end of the adder to ensure that the MOS transistor of the voltage-current converter operates in a saturation region. That is, as shown in FIG. 6c, a series resistor R' is electrically connected between source electrodes of two MOS transistors of the voltage-current converter, to ensure that the MOS transistors of the voltage-current converter operate in the saturation region.

Furthermore, the signal processing unit further includes a second amplifier unit 205, which is electrically connected between the switched capacitor filter module 204 and the converter 206, and is configured to amplify the differential signal output by the adder. The second amplifier unit outputs amplified differential signals P3 and N3. In the embodiment, the second amplifier unit is a programmable gain amplifier with a gain of 5.

In the embodiment, the total amplification gain of the first amplifier unit, the adder and the second amplifier with respect to amplifying the magnetic field signal ranges from 800 to 2000 inclusively, and is preferably 1000. In other embodiments, the magnetic field signal may be amplified with a required gain by setting different gains for the first amplifier unit, the adder and the second amplifier unit.

Figure 7A:
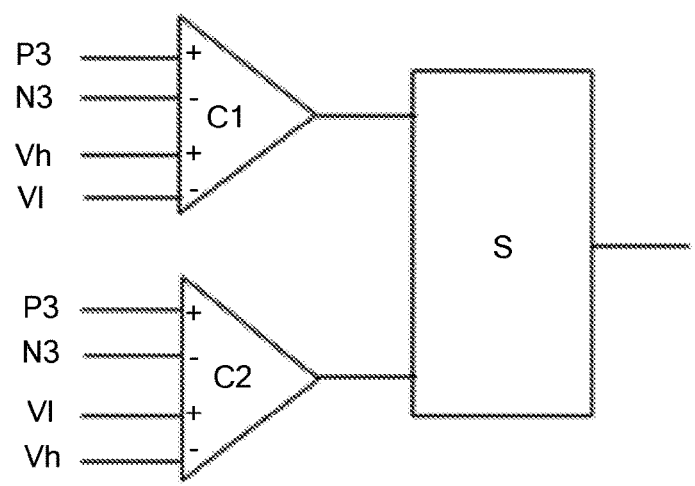
FIG. 7a is a schematic diagram of a converter according to an embodiment of the present disclosure.

As shown in FIG. 1a, after processed by the switched capacitor filter module and the second amplifier unit, the differential signal needs to be converted into a magnetic field signal under control of the timing controller 300, to control the output control circuit. FIG. 7a shows a structural diagram of a converter according to an embodiment of the present disclosure. The converter includes: a first comparator C1, a second comparator C2 and a latch logical circuit S.

The first comparator C1 and the second comparator C2 are each electrically connected to a pair of differential reference voltages Vh and Vl and a pair of differential signals P3 and N3 output by the second amplifier unit. The pair of differential reference voltages of the first comparator C1 and the pair of differential reference voltages of the second comparator C2 are reversely electrically connected. The first comparator C1 is configured to compare a voltage signal output by the second amplifier unit with a high threshold Rh, and the second comparator C2 is configured to compare the voltage signal output by the second amplifier unit with a low threshold Rl. Output ends of the first comparator C1 and the second comparator C2 are electrically connected to input ends of the latch logical circuit S.

Figure 7B:
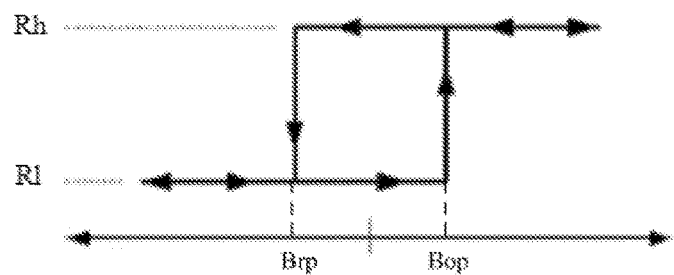
FIG. 7b is a schematic diagram of a principle for determining a polarity of a magnetic field according to an embodiment of the present disclosure.

As shown in FIG. 7b, the first comparator C1 is configured to output a result of comparison between the voltage signal output by the second amplifier unit and the high threshold Rh, or a result of comparison between a strength of the external magnetic field and a predetermined operation point Bop. The second comparator C2 is configured to output a result of comparison between the voltage signal output by the second amplifier unit and the low threshold Rl or a result of comparison between the strength of the external magnetic field and a predetermined releasing point Brp.

The latch logical circuit S is configured to make the signal processing unit 300 output a signal at a first level (such as the high level) to represent a magnetic polarity of the external magnetic field, when the comparison result output by the first comparator C1 indicates that the voltage signal output by the second amplifier unit is greater than the high threshold Rh or the strength of the external magnetic field reaches the predetermined operation point Bop.

The latch logical circuit S is configured to make the signal processing unit 300 output a signal at a second level (low level) opposite to the first level to represent another kind of magnetic polarity of the external magnetic field, when the comparison result output by the second comparator C2 indicates that the voltage signal output by the second amplifier unit is lower than the low threshold Rl or the strength of the external magnetic field does not reach the predetermined releasing point Brp.

The latch logical circuit S is make the magnetic field detection circuit 200 output in an original output state, when the comparison results output by the first comparator C1 and the second comparator C2 indicate that the voltage signal output by the second amplifier unit is smaller than the higher threshold Rh and is greater than the lower threshold Rl, or indicate that the strength of the external magnetic field does not reach the operation point Bop and reaches the releasing point Brp.

Figure 8:
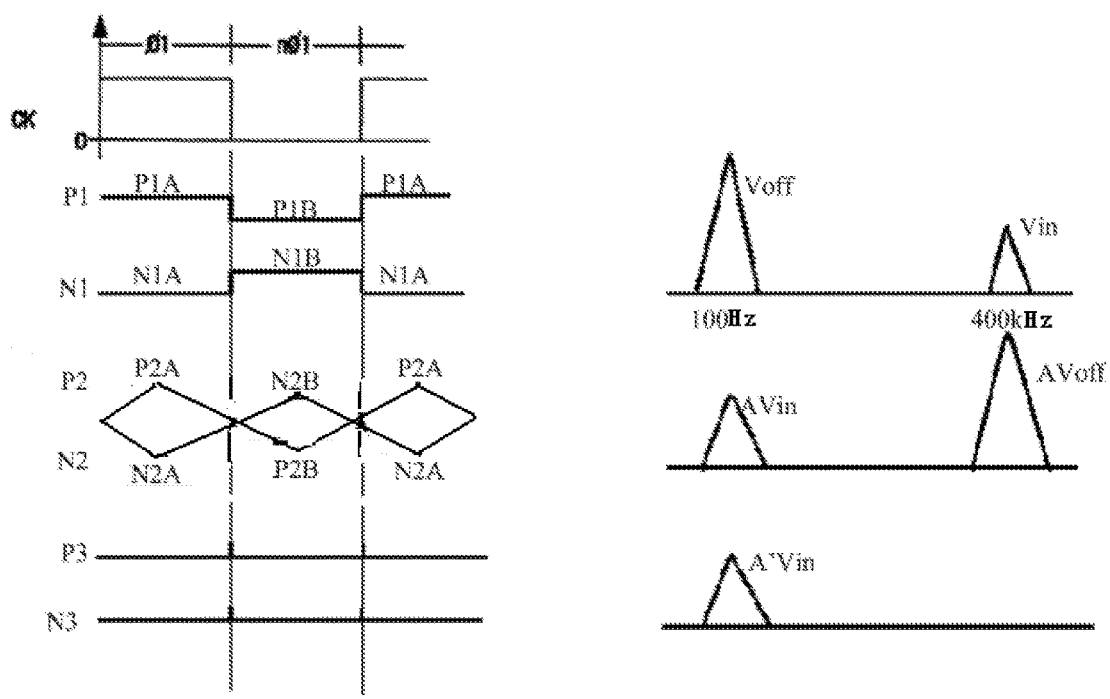
FIG. 8 is a schematic diagram of outputs of periodic clock signals according to an embodiment of the present disclosure.

The second clock signal output from the timing controller to the latch logical circuit S is delayed for a second predetermined time with respect to the third clock signal, such as 5 nanoseconds, to avoid a switching point of the switched capacitor filter. The signal process of the signal processing unit according to an embodiment of the present disclosure is described in detail in reference with FIG. 8. The left portion of FIG. 8 shows differential signals output by respective modules under control of clock signals, and the right portion of FIG. 8 show a schematic diagram of a signal corresponding to the differential signals in a frequency domain.

It can be seen from the above description that, the output signal Vout of the first chopping switch is a superposition of the offset signal Vos and the ideal magnetic field signal Vin, and equals to a difference between the differential signals P1 an N1. The differential signals P1 and N1 have the same magnitude and opposite directions. It can be seen from the above description that, for first and second half cycles of the clock signal CK1, ideal magnetic field voltage signals output by the first chopping switch have the same magnitude and opposite directions. As shown on the left portion of FIG. 8, the signal P1 is respectively represented as P1A and P1B in the first and second half cycles of clock signal, and the signal N1 is respectively represented as N1A and N1B in the first and second half cycles of clock signal. P1A, P1B, N1A and N1B are respectively represented as:

$$P1A=(Vos+Vin)/2;\ P1B=(Vos-Vin)/2$$

$$N1A=-P1A=-(Vos+Vin)/2;\ N1B=-P1B=-(Vos-Vin)/2.$$

For easy understanding, the coefficient ½ of the differential signal is omitted in descriptions hereinafter. A pair of differential signals P1' and N1' are input into the second chopping switch via the first amplifier. The signal P1' is respectively represented as P1A' and P1B' in the first and second half cycles of clock signal, and the signal N1' is respectively represented as N1A' and N1B' in the first and second half cycles of clock signal. Due to a bandwidth limitation of the first amplifier A1, the differential signals output via the first amplifier A1 are triangular wave differential signals. The following formula is only a signal form. The signals are respectively represented as:

$$P1A'=A(Voff+Vin)/2;\ P1B'=A(Voff-Vin)/2$$

$$N1A'=-P1A'=-A(Voff+Vin)/2;\ N1B'=-P1B'=-A(Voff-Vin)/2.$$

A is gain of the first amplifier, Voff is the offset of the output signal of the first amplifier which equals to a sum of an inherent offset Vos of the magnetic sensor 200 and the offset of the first amplifier. The offset Voff is variable due to the bandwidth limitation of the first amplifier A1. For easy understanding, a coefficient of the differential signal and an amplification coefficient of the amplifier are omitted in the descriptions hereinafter.

The second chopping switch Z2 is configured to directly output the pair of differential signals in a first half cycle of each clock cycle, and exchange the differential signals and output the exchanged differential signals in a second half cycle of each clock cycle. The differential signals output by the second chopping switch are represented as P2 and N2. The signal P2 is represented as P2A and P2B in first and second half cycles of clock signal, and the signal N2 is represented as N2A and N2B in first and second half cycles of clock signal. Outputs of the signals P2 and N2 are respectively represented as:

$$P2A=P1A'=(Voff+Vin); P2B=N1B'=-(Voff-Vin)$$

$$N2A=N1A'=-(Voff+Vin); N2B=P1B'=(Voff-Vin);$$

The four switched capacitor filters of the switched capacitor filter module 303 sample each signal included in the differential signals P2 and N2 in first and second half cycles of each clock cycle respectively, and output two pairs of sampled signals. That is, a pair of sampled signals acquired by the switched capacitor filter module includes P2A and P2B, and the other pair of sampled signals acquired by the switched capacitor filter module includes N2A and N2B.

The four sampled signals are input into the adder, and the adder output P3 and N3. The adder adds two pairs of respective sampled signals of the two pairs and outputs P3 and N3, where $$P3=P2A+P2B=(Voff+Vin)+(-(Voff-Vin))=2Vin; \text{ and}$$

$$N3=N2A+N2B=-(Voff+Vin)+(Voff-Vin)=-2Vin.$$

It can be seen that, the signals P3 and N3 output by the adder only include amplified ideal magnetic field voltage signals, and the offset signals are eliminated.

In addition, the magnetic sensor integrated circuit according to the embodiment of the present disclosure further includes a counter 207 electrically connected to the converter 206. The counter 207 can output a magnetic field detection signal (i.e. the differential signal) output by the converter 206 after counting for a predetermined time. The output of magnetic field detection signal is delayed for a predetermined time (such as 50 microseconds) by the counting of the counter 207, thereby ensuring an enough response time of the overall circuit.

Figure 9:
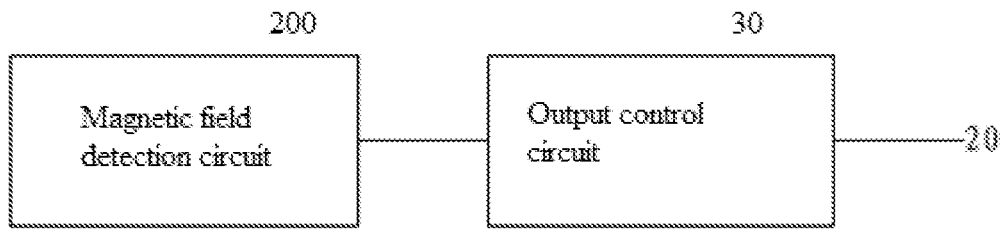
FIG. 9 a block diagram of a magnetic sensor integrated circuit according to an embodiment of the present disclosure.

FIG. 9 shows a block diagram of a magnetic sensor integrated circuit. The magnetic sensor integrated circuit further comprises an output port 20 and an output control circuit 30 coupled between the magnetic field detection circuit 200 and the output control circuit 30.

The output control circuit 30 can control the magnetic sensor integrated circuit to operate in at least the first state or second state. In the embodiment, the first state can be a current flow from the output port 20 to the outside, and the second state can be a current flow from the outside into the output port 20. The output control circuit 30 is powered by a direct-current voltage of the second output end V2 of the full-wave rectifier bridge 110. In detail, the magnetic sensor integrated circuit may operate in the first state in which the load current flows out of the output port 20, or may operate in the second state in which the load current flows into the output port 20, or may operate in the first state and the second state alternately. Therefore, in another embodiment of the present disclosure, the output control circuit 30 may be further configured to in response to a control signal under a predetermined condition. The integrated circuit operates in at least one state of the first state in which the load current flows from the output port 20 to the outside and the second state in which the load current flows from the outside into the output port 20; and when the predetermined condition is not satisfied, the integrated circuit operates in a third state in which the operation in the first state or the second state is prevented. In a preferred embodiment, a frequency of occurrence of the third state is directly proportional to a frequency of the alternating-current power.

In the magnetic sensor integrated circuit according to the embodiments of the present disclosure, a type of the third state of the output control circuit 30 may be configured based on user requirements, as long as the output control circuit 30 is prevented from entering into the first state or the second state. For example, when the output control circuit 30 operates in the third state, the output control circuit 30 makes no response to the magnetic field sensing signal (which may be understood as that the magnetic field sensing signal can not be acquired) or the current at the output port 20 is much less than the load current (for example, less than a quarter of the load current, in this case, the current may be substantially omitted with respect to the load current).

The counter 207 can start counting in response to acquiring a predetermined triggering signal. When the counting period of time reaches the predetermined time, it is indicated that the magnetic sensor integrated circuit satisfies a predetermined condition and the magnetic sensor integrated circuit starts operation. Specifically, the predetermined triggering signal may be generated when a specified voltage in the magnetic sensor integrated circuit rises and reaches a predetermined threshold. In the embodiment, the specified voltage may be the supply voltage of the signal processing unit. In the third state, the output control circuit 400 enters into the first state or second state, after the counter 306 counts for the predetermined time such as 50 microseconds after acquiring the predetermined triggering signal.

Based on the above embodiments, in an embodiment of the present disclosure, the output control circuit 30 includes a first switch and a second switch. The first switch and the output port are electrically connected in a first current path, and the second switch and the output port are electrically connected in a second current path with a direction opposite to a direction of the first current path. The first switch and the second switch are selectively switched on under a control of the magnetic field detection signal. Optionally, the first switch is a diode, and the second switch is a diode or transistor, which is not limited herein, and depends on the situation.

Figure 10:
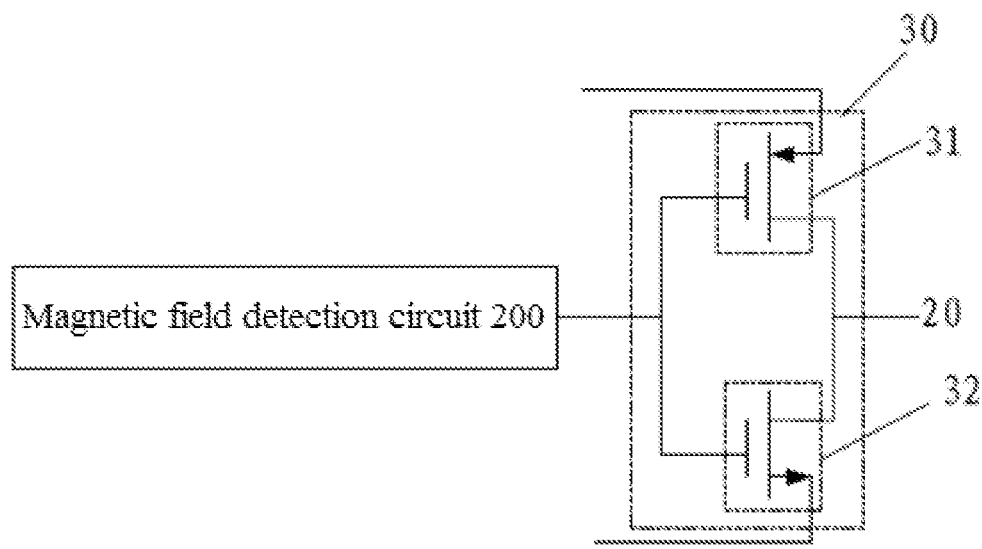
FIG. 10 is a schematic circuit diagram of an output control circuit according to an embodiment of the present disclosure.

In an embodiment of the present disclosure, as shown in FIG. 10, a first switch 31 and a second switch 32 are a pair of complementary semiconductor switches. The first switch 31 is switched on when the low level is applied thereto and the second switch 32 is switched on when the high level is applied thereto. The first switch 31 and the output port 20 are electrically connected in the first current path, and the second switch 402 and the output port 20 are electrically connected in the second current path. Control ends of the first switch 31 and the second switch 32 are both electrically connected to the magnetic field detection circuit 200. A current input end of the first switch 31 is electrically connected to a high voltage (such as a direct-current power), a current output end of the first switch 31 is electrically connected to a current input end of the second switch 32, and a current output end of the second switch 32 is electrically connected to a low voltage (such as a grounded end). If the magnetic field detection signal output by the magnetic field detection circuit 200 is low level, the first switch 31 is switched on while the second switch 32 is switched off, and a load current flows out from a high voltage via the first switch 31 and the output port 20. If the magnetic field detection signal output by the magnetic field detection circuit 200 is high level, the second switch 32 is switched on while the first switch 31 is switched off, and the load current flows from outside into the output port 20 and flows through the second switch 32. In an example shown in FIG. 10, the first switch 31 is a positive channel metal oxide semiconductor field effect transistor (P-type MOSFET), and the second switch 32 is a negative channel metal oxide semiconductor field effect transistor (N-type MOSFET). It can be understood that, in other embodiments, the first and second switches may be semiconductor switches of other types, for example, may be other field effect transistors such as a junction field effect transistor (JFET) and a metal semiconductor field effect transistor (MESFET).

Figure 11:
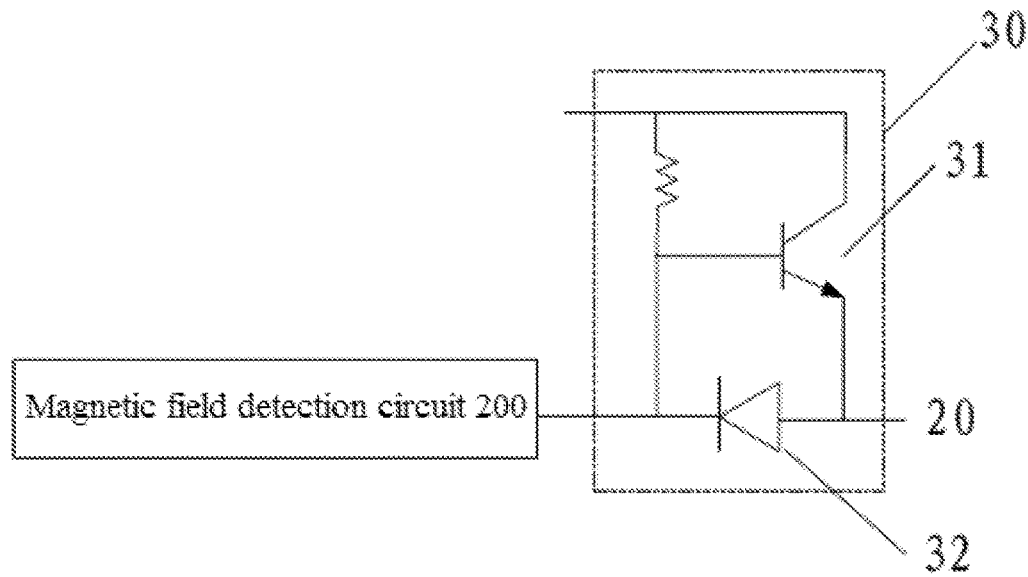
FIG. 11 is a schematic circuit diagram of an output control circuit according to another embodiment of the present disclosure.

In another embodiment of the present disclosure, as shown in FIG. 11, the first switch 31 is switched on when the high level is applied thereto, the second switch 32 is an unidirectional conducting diode. And a control end of the first switch 31 and a cathode of the second switch 32 are electrically connected to an output end of the converter. A current input end of the first switch 31 is electrically connected to an output end of the rectifier circuit, and a current output end of the first switch 31 is electrically connected to an anode of the second switch 31 and an output port 20. The first switch 31 and the output port 20 are electrically connected in the first current path, and the output port 20, the second switch 32 and the magnetic field detection circuit 200 are electrically connected in the second current path. If the magnetic field detection signal output by the magnetic field detection circuit 200 is high level, the first switch 31 is switched on while the second switch 32 is switched off, and a load current flows from the rectifier circuit to the outside via the first switch 31 and the output port 20. If the magnetic field detection signal output by the magnetic field detection circuit 200 is low level, the second switch 32 is switched on while the first switch 31 is switched off, and a load current flows from outside into the output port 20 and flows through the second switch 32. It can be understood that, in other embodiments of the present disclosure, the first switch 31 and the second switch 32 may have other structures, which is not limited herein, and depends on the situation.

In another embodiment of the present disclosure, the output control circuit includes a first current path in which a current flows from the output port to the outside, a second current path in which a current flows from the output port to the inside, and a switch electrically connected to one of the first current path and the second current path. The switch is controlled by magnetic field detection signal output by the signal processing unit, to switch on the first current path and the second current path selectively. Optionally, no switch is arranged in the other path of the first current path and the second current path.

Figure 12:
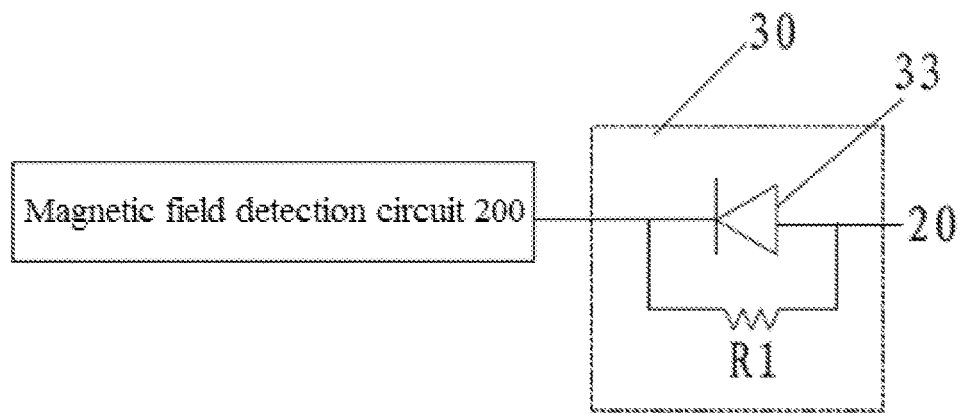
FIG. 12 is a schematic circuit diagram of an output control circuit according to yet another embodiment of the present disclosure.

As an implementation, as shown in FIG. 12, the output control circuit 30 includes a unidirectional conducting switch 33 electrically connected to the output port 20 in the first current path. A current input end of the unidirectional conducting switch 33 may be electrically connected to an output end of the magnetic field detection circuit 200. The output end of the magnetic field detection circuit 200 may be electrically connected to the output port 20 via a resistor R1 in the second current path, a direction of which is opposite to a direction of the first current path. The unidirectional conducting switch 33 is switched on when the magnetic field sensing signal is at the high level, and a load current flows to the outside via the unidirectional conducting switch 33 and the output port 20. The unidirectional conducting switch 33 is switched off when the magnetic field sensing signal is at the low level, and a load current flows from the outside into the output port 20 and flows through the resistor R1 and the magnetic field detection circuit 200. Alternatively, the resistor R1 in the second current path may be replaced with a unidirectional conducting switch electrically connected to the unidirectional conducting switch 33 in parallel back to back, such that the load current flowing out of the output port is balanced with the load current flowing into the output port.

In another implementation, as shown in FIG. 12a, the output control circuit 30 includes diodes D1 and D2, a resistor R1 and a resistor R2. The diodes D1 and D2 are reversely electrically connected in series between the output end of the magnetic field detection circuit 200 and the output port 20. The resistor R1 is electrically connected to the series-electrically connected diodes D1 and D2 in parallel. The resistor R2 is electrically connected between a power Vcc and a common end of the diodes D1 and D2. A cathode of the diode D1 is electrically connected to the output end of the magnetic field detection circuit 200. The diode D1 is controlled by the magnetic field detection information. When the magnetic detection signal is high level, the diode D1 is switched off and a load current flows from an output port Pout to the outside via the resistor R2 and the diode D2. When the magnetic field detection signal is low level, a load current flows from the outside into the output port Pout and flows through the resistor R1 and the magnetic field detection circuit 200.

The magnetic field integrated circuit according to the embodiments of the present disclosure is described in conjunction with a specific application as follows.

Figure 13:
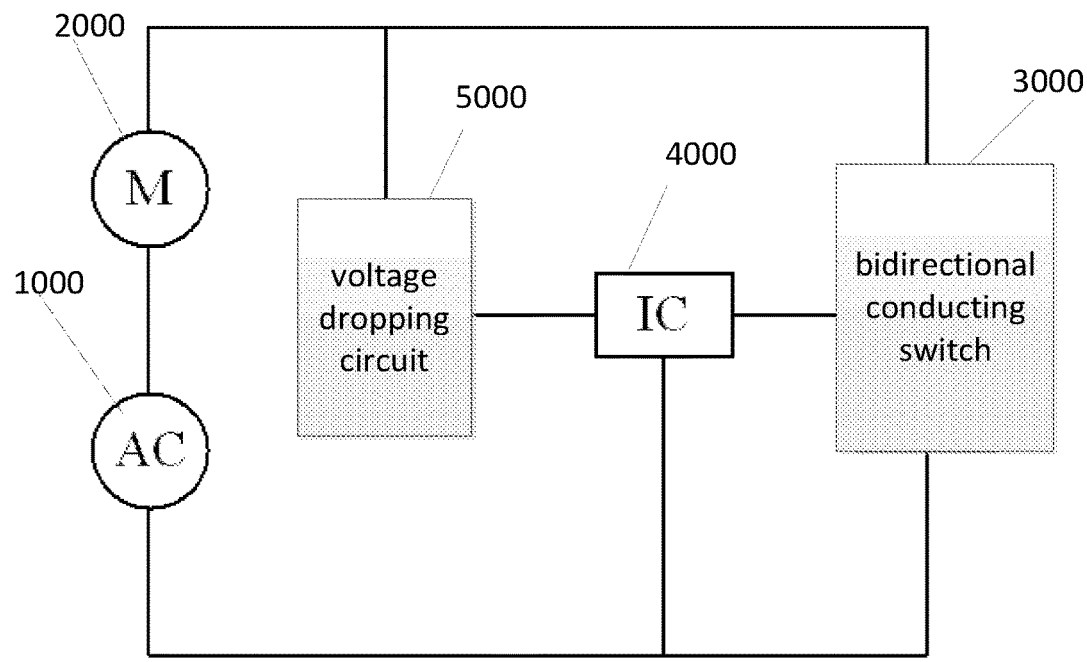
FIG. 13 is a schematic structural diagram of a circuit of a motor assembly according to an embodiment of the present disclosure.

As shown in FIG. 13, an electric motor assembly is further provided according to an embodiment of the present disclosure. The electric motor assembly includes an electric motor 2000 powered by an alternating-current power 1000, a bidirectional conducting switch 3000 electrically connected to the electric motor 2000 in series, and a magnetic sensor integrated circuit 4000 according to any one of the above embodiments of the present disclosure. An output port of the magnetic sensor integrated circuit 4000 is electrically connected to a control end of the bidirectional conducting switch 3000. Preferably, the bidirectional conducting switch 3000 may be a triode alternating current switch (TRIAC). It can be understood that, the bidirectional conducting switch may be implemented with other suitable types of switches. For example, the bidirectional conducting switch may include two silicon controlled rectifiers electrically connected in reverse parallel and a corresponding control circuit. The two silicon controlled rectifiers are controlled by the control circuit in a predetermined manner based on an output signal output by the output port of the magnetic sensor integrated circuit. Preferably, the electric motor further includes a voltage-dropping circuit 5000 to drop the voltage of the alternating-current power 1000 and provide the dropped voltage to the magnetic sensor integrated circuit 4000. The magnetic sensor integrated circuit 4000 is arranged in proximity to a rotor of the electric motor 2000 to sense a change of a magnetic field of the rotor.

Figure 14:
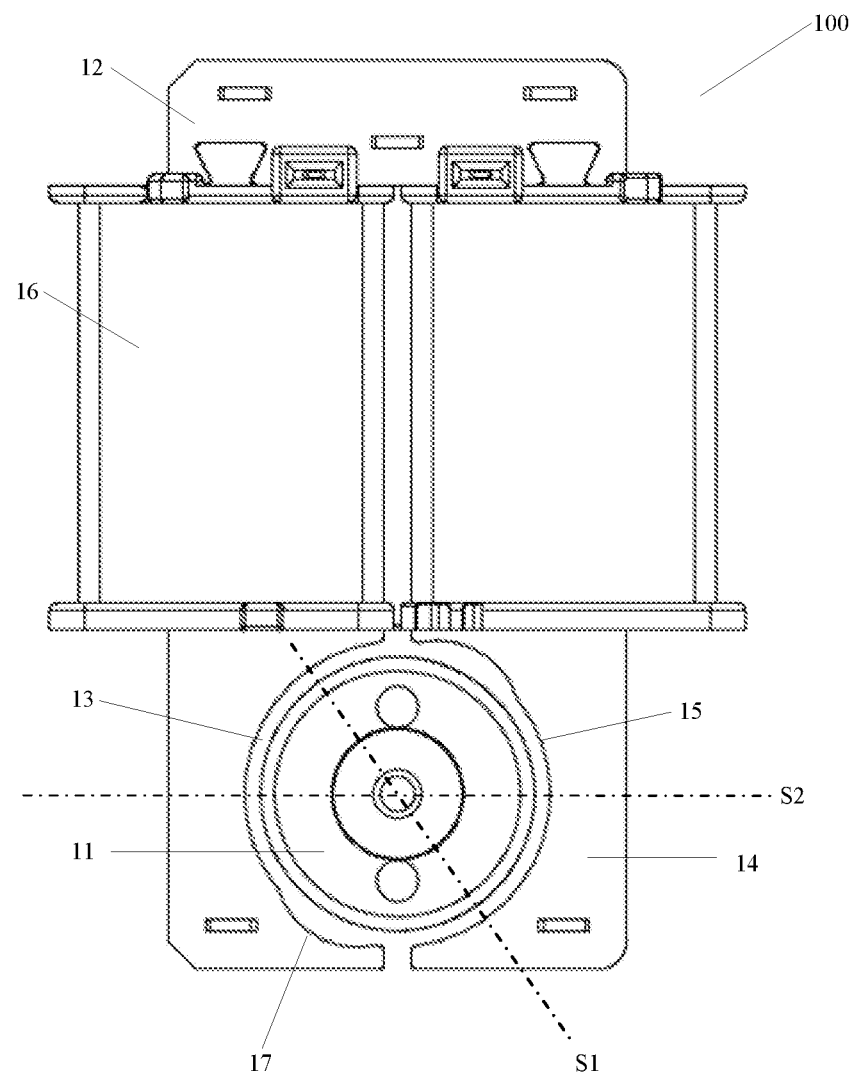
FIG. 14 is a schematic structural diagram of a synchronous motor according to an embodiment of the present disclosure.

Based on the above embodiment, in an embodiment of the present disclosure, the electric motor is a synchronous electric motor. It can be understood that, the magnetic sensor integrated circuit according to the present disclosure is not only applied in the synchronous electric motor, but also applied in other types of permanent magnet electric motor such as direct-current brushless motor. As shown in FIG. 14, the synchronous motor includes a stator and a rotor 1001 rotating with respect to the stator. The stator includes a stator core 1002 and a stator winding 1006 wound around the stator core 1002. The stator core 1002 may be made of soft magnetic material such as pure iron, cast iron, cast steel, electrical steel and silicon steel. The rotor 1001 includes a permanent magnet. When the stator winding 1006 is electrically connected to the alternating current power in series, the rotor 1001 rotates with a constant speed of a constant rotation rate of (60 f/p) rpm in a steady state, where f is a frequency of the alternating-current power, and p is a number of pole-pairs of the rotor. In the embodiment, the stator core 1002 has two pole portions 1004 arranged oppositely. Each of the pole portions has a polar arc surface 1005. An external surface of the rotor 1001 faces the polar arc surface 1005, and a substantially uniform air gap is formed therebetween. The basically uniform air gap in the present disclosure indicates that majority of the air gap between the stator and the rotor is uniform, and minority of the air gap between the stator and the rotor is non-uniform. Preferably, a concave starting groove 1007 is arranged on the polar arc surface 1005 of the pole portion of the stator. Portions other than the starting groove 1007 on the polar arc surface 1005 are concentric with the rotor. With the above configurations, a non-uniform magnetic field may be formed which ensures that when the rotor does not rotate, a polar axis S1 of the rotor is tilted with an angle with respect to a central axis S2 of the pole portion of the stator, so that the rotor can have a starting torque each time when the electric motor is powered on under an effect of the integration circuit. The polar axis S1 of the rotor is a boundary between two magnetic poles of the rotor with different polarities. The central axis S2 of the pole portion 1004 of the stator is a connection line passing through centers of the two pole portions 1004 of the stator. In the embodiment, the stator and the rotor each have two magnetic poles. It can be understood that, in other embodiments, the number of magnetic poles of the stator may be different from the number of magnetic poles of the rotor, and the stator and the rotor may have more magnetic poles such as four magnetic poles and six magnetic poles.

Preferably, the output control circuit 30 is configured to switch on the bidirectional conducting switch 3000, when the alternating-current power 1000 operates in a positive half cycle and the magnetic sensor detects that a magnetic field of the permanent magnet rotor has a first polarity, or when the alternating-current power 1000 operates in a negative half cycle and the magnetic sensor detects that the magnetic field of the permanent magnet rotor has a second polarity opposite to the first polarity. The output control circuit 30 switches off the bidirectional conducting switch 3000, when the alternating-current power 1000 operates in the negative half cycle and the permanent magnet rotor has the first polarity, or when the alternating-current power 1000 operates in the positive half cycle and the permanent magnet rotor has the second polarity.

Based on the above embodiment, in an embodiment of the present disclosure, the output control circuit 30 is configured to turn on the bidirectional conducting switch 3000, when the alternating-current power 1000 operates in the positive half cycle and the magnetic field detection circuit 200 detects that the magnetic field of the permanent magnet rotor with the first polarity, or when the alternating-current power 1000 operates in the negative half cycle and the magnetic field detection circuit detects that the magnetic field of the permanent magnet rotor with the second polarity opposite to the first polarity; and to turn off the bidirectional conducing switch 3000, when the alternating-current power 1000 operates in the negative half cycle and the permanent magnet rotor has the first polarity, or when the alternating-current power 1000 operates in the positive half cycle and the permanent magnet rotor has the second polarity.

Preferably, the output control circuit 30 is configured to control a current to flow from the integrated circuit to the bidirectional conducting switch 3000, when the signal output by the alternating-current power 1000 is in the positive half cycle and the magnetic sensor detects that the magnetic field of the permanent magnet rotor with the first polarity; and control a current to flow from the bidirectional conducting switch 3000 to the integrated circuit, when the signal output by the alternating-current power 1000 is in the negative half cycle and the magnetic sensor detects that the magnetic field of the permanent magnet rotor with the second polarity opposite to the first polarity. It can be understood that, when the permanent magnet rotor has the first magnetic polarity and the alternating-current power is in the positive half cycle, the current may flow out of the integrated circuit for the entire or a portion of the positive half cycle; and when the permanent magnet rotor with the second magnetic polarity and the alternating-current power is in the negative half cycle, the current may be flowing into of the integrated circuit for the entire or a portion of the negative half cycles.

In a preferred embodiment of the present disclosure, the rectifier circuit 100 has a circuit as shown in FIG. 2, the output control circuit 400 has a circuit as shown in FIG. 10. The current input end of the first switch 31 of the output control circuit 30 is electrically connected to the second output end V2 of the full-wave rectifier bridge 110, and the current output end of the second switch 32 is electrically connected to a grounded end of the full-wave rectifier bridge 110. When a signal output by the alternating-current power 1000 is in a positive half cycle and the magnetic sensor outputs a low level signal, the first switch 31 is switched on and the second switch 32 is switched off in the output control circuit 30, and a current sequentially flows through the alternating-current power 1000, the electric motor 2000, a first input end of the magnetic sensor integrated circuit 4000, a voltage-dropping circuit (not shown in the drawings), the second diode 112 of the full-wave rectifier bridge 110 and the first switch 31 of the output control circuit 400, and flows from the output port to the bidirectional conducting switch 3000 and then returns to the alternating-current power 1000. When the bidirectional conducting switch 3000 is switched on, a series branch formed by the voltage-decreasing circuit 5000 and the magnetic sensor integrated circuit 4000 is short-circuited, the magnetic sensor integrated circuit 4000 stops outputting due to absence of supply voltage, and the bidirectional conducting switch 3000 remains being switched on while no driven current flows between a control pole and a first anode of the bidirectional conducting switch 3000, since a current flowing through two anodes of the bidirectional conducting switch 3000 is large enough (larger than a holding current of the bidirectional conducting switch 3000). When the signal output by the alternating-current power 1000 operates in a negative half cycle and a magnetic field detection signal output by the magnetic sensor is high level, the first switch 31 is switched off while the second switch 32 is switched on in the output control circuit 30, and a current flows from the alternating-current power 1000, flows into the output port via the bidirectional conducting switch 3000, and return to the alternating-current power 1000 via the second switch 32 of the output control circuit 30, the first diode 111 of the full-wave rectifier bridge 110, the first input end of the magnetic sensor integrated circuit 4000 and the electric motor 2000. Similarly, when the bidirectional conducting switch 3000 is switched on, the magnetic sensor integrated circuit 4000 is short-circuited and thus stops outputting, and the bidirectional conducting switch 3000 may remain being switched on. When the signal output by the alternating-current power 1000 operates in the positive half cycle and the magnetic field detection signal output by the magnetic sensor is high level, or when the signal output by the alternating-current power 1000 operates in the negative half cycle and the magnetic detection signal output by the magnetic sensor is low level, the first switch 31 and the second switch 32 of the output control circuit 30 are switched off and the bidirectional conducting switch 3000 is switched off. Therefore, the output control circuit 30 can control, based on a polarity change and a differential signal of the alternating-current power 1000, the integrated circuit to switch the bidirectional conducting switch 3000 on and off in a predetermined manner. In this way, the way of powering the stator winding 1006 is controlled, and a changing magnetic field generated by the stator matches with a magnetic field position of the rotor, thereby dragging the rotor to rotate along a signal direction, which ensures that the rotor rotates in a fixed direction each time when the electric motor is powered on.

In the embodiment of the present disclosure, the magnetic field detection signal is a switch-type detection signal. In a steady stage of the electric motor, a switching frequency of the switch-type detection signal is twice the frequency of the alternating-current power.

It can be understood that, in the above embodiments, the magnetic sensor integrated circuit according to the present disclosure is described only in conjunction with a possible application, and the magnetic sensor according to the present disclosure is not limited thereto. For example, the magnetic sensor is not only applied in an electric motor driving, but can also be applied in other applications with magnetic field detection.

In a motor according to another embodiment of the present disclosure, the motor may be electrically connected to a bidirectional conducting switch in series between two ends of an external alternating-current power. A first series branch formed by the electric motor and the bidirectional conducting switch is parallel-electrically connected to a second series branch formed by a voltage-decreasing circuit and a magnetic sensor integrated circuit. An output port of the magnetic sensor integrated circuit is electrically connected to the bidirectional conducting switch, to control the bidirectional conducting switch to switch on and switch off in a predetermined manner, thereby controlling a way of powering the stator winding.

Accordingly, an application apparatus is further provided according to an embodiment of the present disclosure. The application apparatus includes a motor powered by an alternating-current power, a bidirectional conducting switch electrically connected to the electric motor in series, and the magnetic sensor integrated circuit according to any one of the above embodiments. An output port of the magnetic sensor integrated circuit is electrically connected to a control end of the bidirectional conducting switch. Optionally, the application apparatus may be a pump, a fan, a household appliance, a vehicle and the like, where the household appliance, for example, may be a washing machine, a dishwasher, a range hood, an exhaust fan and the like.

With the above descriptions of the disclosed embodiments, those skilled in the art may achieve or use the present disclosure. Various modifications to the embodiments are apparent for those skilled in the art. The general principle defined herein may be implemented in other embodiments without departing from the spirit or scope of the disclosure. Therefore, the present disclosure is not limited to the embodiments disclosed herein, but confirm to the widest scope in consistent with the principle and the novel features disclosed herein.

The invention claimed is:

1. A magnetic sensor integrated circuit, comprising:
    a rectifier circuit converting an external power into a DC power;
    a magnetic field detection circuit sensing a polarity of an external magnetic field and outputting a magnetic detection signal; wherein the magnetic field detection circuit is powered by the DC power of the rectifier circuit and comprises a magnetic sensor, a first chopping switch, a first amplifier unit and a switched capacitor filter module;
    a timing controller outputting a first clock signal to the first chopping switch and the first amplifier unit, and a second clock signal to the switched capacitor filter module; wherein a frequency of the first clock signal is same with a frequency of the second clock signal, and the second clock signal is delayed for the first clock signal with a first predetermined time.

2. The magnetic sensor integrated circuit according to claim 1, further comprising a converter; wherein the timing controller outputs a third clock signal to the converter, and the second clock signal is delayed for the third clock signal with a second predetermined time.

3. The magnetic sensor integrated circuit according to claim 2, wherein the first predetermined time is longer than the second predetermined time.

4. The magnetic sensor integrated circuit according to claim 2, wherein a frequency of the third clock signal is same with the frequency of the first clock signal.

5. The magnetic sensor integrated circuit according to claim 2, wherein the first, second, and third clock signals have a frequency ranging from 100 KHz to 600 KHz inclusively.

6. The magnetic sensor integrated circuit according to claim 2, wherein the converter comprises a first comparator, a second comparator and a latch logic circuit, the first comparator is electrically coupled to a pair of differential reference voltages and a pair of deferential signals output by the second amplifier unit, and the second comparator is electrically coupled to a pair of differential reference voltages and a pair of deferential signals output by the second amplifier unit, wherein the pair of differential reference voltages electrically connected to the first comparator are reversely with the pair of differential reference voltages electrically connected to the second comparator; and
    the first comparator is configured to output a comparison result between a voltage signal output by the second amplifier unit and a high threshold or a comparison result between a magnetic field strength and a predetermined operation point, the second comparator is configured to output a comparison result between the voltage signal output by the second amplifier unit and a low threshold or a comparison result between the magnetic field strength and a predetermined releasing point; and the latch logic circuit is configured to make the converter output a first level when the comparison result output by the first comparator indicates that the voltage signal output by the second amplifier unit is higher than the high threshold or the magnetic field strength reaches the predetermined operation point, and make the converter output a second level reverse to the first level when the comparison result output by the second comparator indicates that the voltage signal output by the second amplifier unit is lower than the low threshold or the magnetic field strength does not reach the predetermined releasing point, and make the converter remain in an original output state when the comparison results output by the first comparator and the second comparator indicate that the voltage signal output by the second amplifier unit is lower than the high threshold and greater than the low threshold or indicate that the magnetic field strength does not reach the operation point and reaches the releasing point.

7. The magnetic sensor integrated circuit according to claim 3, wherein the second predetermined time is five nanoseconds.

8. The magnetic sensor integrated circuit according to claim 1, wherein the first predetermined time is ¼ period of the first clock signal.

9. The magnetic sensor integrated circuit according to claim 1, wherein the first clock signal comprises at least two non-overlapping sub clock signals.

10. The magnetic sensor integrated circuit according to claim 1, wherein the second clock signal comprises at least two non-overlapping sub clock signals.

11. The magnetic sensor integrated circuit according to claim 1, wherein the magnetic sensor comprises a first terminal, a second terminal, a third terminal opposite to the first terminal, and a fourth terminal opposite to the second terminal;
  a first discharging branch coupled between the first terminal and the third terminal;
  a second discharging branch coupled between the second terminal and the fourth terminal;
  wherein before the first terminal and the third terminal serve as power input terminals, the second terminal and the fourth terminal serve as magnetic field detection signal output terminals, the second discharging branch is turned on; before the first terminal and the third terminal serve as the magnetic field detection signal output terminals, the second terminal and the fourth terminal serve as power input terminals, the first discharging branch is turned on.

12. The magnetic sensor integrated circuit according to claim 1, wherein the switched capacitor filter module comprises: a first switched capacitor filter, a second switched capacitor filter, a third switch capacitor filter and a fourth switched capacitor filter; and
  the first switched capacitor filter and the second switched capacitor filter sample the differential signal output by the first amplifier unit in a first half cycle as a first sampled signal, and the third switched capacitor filter and the fourth switched capacitor filter sample the differential signal output by the first amplifier unit in a second half cycle as a second sampled signal.

13. The magnetic sensor integrated circuit according to claim 1, wherein a differential signal output by the magnetic sensor comprises a magnetic field signal and an offset signal, the first chopping switch to modulates the magnetic field signal and the offset signal to a high-frequency region and a baseband frequency respectively.

14. The magnetic sensor integrated circuit according to claim 13 wherein the first amplifier unit comprises a first amplifier, a second chopping switch and a second amplifier; and the first amplifier and the second amplifier amplify an input signal, and the second chopping switch demodulates the magnetic field signal of the differential signal output by the first chopping switch to the baseband frequency.

15. A motor assembly, comprising a motor powered by an alternating-current power and the magnetic sensor integrated circuit according to claim 1.

16. An application apparatus comprising a motor assembly, wherein the motor assembly comprises a motor powered by an alternating-current power and the magnetic sensor integrated circuit according to claim 1.

17. The application apparatus according to claim 16, comprising a pump, a fan, a household appliance or a vehicle.

18. A magnetic sensor integrated circuit, comprising:
  a rectifier circuit converting an external power into a DC power;
  a magnetic field detection circuit sensing a polarity of an external magnetic field and outputting a magnetic detection signal; wherein the magnetic field detection circuit comprises a magnetic sensor, a first chopping switch, a first amplifier unit and a switched capacitor filter module;
  a timing controller outputting a first clock signal to the first chopping switch and the first amplifier unit, and a second clock signal to the switched capacitor filter module; wherein a frequency of the first clock signal is same with a frequency of the second clock signal, and the second clock signal is delayed for the first clock signal with a first predetermined time; and
  wherein the magnetic sensor comprises a first terminal, a second terminal, a third terminal opposite to the first terminal, and a fourth terminal opposite to the second terminal;
  a first discharging branch coupled between the first terminal and the third terminal;
  a second discharging branch coupled between the second terminal and the fourth terminal;
  wherein before the first terminal and the third terminal serve as power input terminals, the second terminal and the fourth terminal serve as magnetic field detection signal output terminals, the second discharging branch is turned on; before the first terminal and the third terminal serve as the magnetic field detection signal output terminals, the second terminal and the fourth terminal serve as power input terminals, the first discharging branch is turned on.

* * * * *